United States Patent
Saito

(10) Patent No.: US 9,299,723 B2
(45) Date of Patent: Mar. 29, 2016

(54) SEMICONDUCTOR DEVICE WITH LIGHT-BLOCKING LAYERS

(75) Inventor: Toshihiko Saito, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 977 days.

(21) Appl. No.: 13/107,270

(22) Filed: May 13, 2011

(65) Prior Publication Data

US 2011/0284838 A1 Nov. 24, 2011

(30) Foreign Application Priority Data

May 21, 2010 (JP) ................................. 2010-116971

(51) Int. Cl.
*H01L 27/12* (2006.01)
*G11C 5/00* (2006.01)
*G11C 7/02* (2006.01)
(Continued)

(52) U.S. Cl.
CPC ............ *H01L 27/1225* (2013.01); *G11C 5/005* (2013.01); *G11C 7/02* (2013.01); *G11C 11/404* (2013.01); *H01L 27/10873* (2013.01); *H01L 27/1156* (2013.01); *H01L 27/11517* (2013.01); *H01L 27/1255* (2013.01);
(Continued)

(58) Field of Classification Search
CPC ............ H01L 27/1225; H01L 27/1255; H01L 27/10873; H01L 27/11517; H01L 27/1156; H01L 28/60; G11C 7/02; G11C 5/005; G11C 11/404
USPC ............................................. 257/43, E29.296
See application file for complete search history.

(56) References Cited

U.S. PATENT DOCUMENTS

| 4,466,081 A | 8/1984 | Masuoka |
| 5,349,366 A | 9/1994 | Yamazaki et al. |

(Continued)

FOREIGN PATENT DOCUMENTS

| CN | 101258607 | 9/2008 |
| CN | 101414436 | 4/2009 |

(Continued)

OTHER PUBLICATIONS

Remashan et al., Impact of Hydrogenation of ZnO TFTs by Plasma-Deposited Silicon Nitride Gate Dielectric; IEEE Transactions on Electronic Devices, vol. 55, No. 10; Published Oct. 2008; pp. 2736-2743.*

(Continued)

*Primary Examiner* — John P Dulka
(74) *Attorney, Agent, or Firm* — Eric J. Robinson; Robinson Intellectual Property Law Office, P.C.

(57) ABSTRACT

One object is to propose a memory device in which a period in which data is held can be ensured and memory capacity per unit area can be increased. The memory device includes a memory element, a transistor including an oxide semiconductor in an active layer for control of accumulating, holding, and discharging charge in the memory element, and a capacitor connected to the memory element. At least one of a pair of electrodes of the capacitor has a light-blocking property. Further, the memory device includes a light-blocking conductive film or a light-blocking insulating film. The active layer is positioned between the electrode having a light-blocking property and the light-blocking conductive film or the light-blocking insulating film.

19 Claims, 19 Drawing Sheets

(51) Int. Cl.
*G11C 11/404* (2006.01)
*H01L 27/108* (2006.01)
*H01L 27/115* (2006.01)
*H01L 49/02* (2006.01)
*G11C 16/04* (2006.01)
*G11C 16/18* (2006.01)
*G11C 16/34* (2006.01)

(52) U.S. Cl.
CPC ............ *H01L 28/60* (2013.01); *G11C 16/0433* (2013.01); *G11C 16/18* (2013.01); *G11C 16/349* (2013.01)

(56) References Cited

U.S. PATENT DOCUMENTS

| Patent | Kind | Date | Assignee | Ref |
|---|---|---|---|---|
| 5,731,856 | A | 3/1998 | Kim et al. | |
| 5,744,864 | A | 4/1998 | Cillessen et al. | |
| 6,127,702 | A | 10/2000 | Yamazaki et al. | |
| 6,281,520 | B1* | 8/2001 | Yamazaki | 257/66 |
| 6,294,274 | B1 | 9/2001 | Kawazoe et al. | |
| 6,445,026 | B1 | 9/2002 | Kubota et al. | |
| 6,556,265 | B1* | 4/2003 | Murade | 349/111 |
| 6,563,174 | B2 | 5/2003 | Kawasaki et al. | |
| 6,569,717 | B1 | 5/2003 | Murade | |
| 6,576,926 | B1 | 6/2003 | Yamazaki et al. | |
| 6,576,943 | B1 | 6/2003 | Ishii et al. | |
| 6,590,227 | B2 | 7/2003 | Ishikawa | |
| 6,590,229 | B1 | 7/2003 | Yamazaki et al. | |
| 6,661,476 | B1* | 12/2003 | Abe et al. | 349/38 |
| 6,727,522 | B1 | 4/2004 | Kawasaki et al. | |
| 6,828,584 | B2 | 12/2004 | Arao et al. | |
| 6,876,023 | B2 | 4/2005 | Ishii et al. | |
| 6,890,784 | B2 | 5/2005 | Yamazaki et al. | |
| 6,927,809 | B2* | 8/2005 | Gotoh et al. | 349/44 |
| 6,967,129 | B2 | 11/2005 | Yamazaki et al. | |
| 7,049,190 | B2 | 5/2006 | Takeda et al. | |
| 7,061,014 | B2 | 6/2006 | Hosono et al. | |
| 7,064,346 | B2 | 6/2006 | Kawasaki et al. | |
| 7,105,868 | B2 | 9/2006 | Nause et al. | |
| 7,192,812 | B2 | 3/2007 | Yasukawa | |
| 7,208,766 | B2 | 4/2007 | Yamazaki et al. | |
| 7,211,825 | B2 | 5/2007 | Shih et al | |
| 7,282,782 | B2 | 10/2007 | Hoffman et al. | |
| 7,297,977 | B2 | 11/2007 | Hoffman et al. | |
| 7,323,356 | B2 | 1/2008 | Hosono et al. | |
| 7,365,393 | B2 | 4/2008 | Yamazaki et al. | |
| 7,385,224 | B2 | 6/2008 | Ishii et al. | |
| 7,394,105 | B2 | 7/2008 | Goto | |
| 7,402,506 | B2 | 7/2008 | Levy et al. | |
| 7,411,209 | B2 | 8/2008 | Endo et al. | |
| 7,414,267 | B2 | 8/2008 | Yamazaki et al. | |
| 7,442,991 | B2 | 10/2008 | Yamazaki et al. | |
| 7,453,065 | B2 | 11/2008 | Saito et al. | |
| 7,453,087 | B2 | 11/2008 | Iwasaki | |
| 7,462,862 | B2 | 12/2008 | Hoffman et al. | |
| 7,468,304 | B2 | 12/2008 | Kaji et al. | |
| 7,501,293 | B2 | 3/2009 | Ito et al. | |
| 7,674,650 | B2 | 3/2010 | Akimoto et al. | |
| 7,675,796 | B2 | 3/2010 | Kurokawa | |
| 7,727,836 | B2 | 6/2010 | Yamazaki et al. | |
| 7,732,819 | B2 | 6/2010 | Akimoto et al. | |
| 7,745,829 | B2 | 6/2010 | Yamazaki et al. | |
| 7,791,074 | B2 | 9/2010 | Iwasaki | |
| 7,791,075 | B2 | 9/2010 | Kobayashi et al. | |
| 7,935,582 | B2 | 5/2011 | Iwasaki | |
| 7,956,361 | B2 | 6/2011 | Iwasaki | |
| 8,030,659 | B2 | 10/2011 | Yamazaki et al. | |
| 8,031,300 | B2 | 10/2011 | Kamijima | |
| 8,164,700 | B2 | 4/2012 | Hatta et al. | |
| 8,420,462 | B2 | 4/2013 | Kobayashi et al. | |
| 8,471,262 | B2 | 6/2013 | Yamazaki et al. | |
| 8,558,241 | B2 | 10/2013 | Yamazaki et al. | |
| 8,575,619 | B2 | 11/2013 | Yamazaki et al. | |
| 8,716,708 | B2* | 5/2014 | Yamazaki et al. | 257/43 |
| 8,946,700 | B2* | 2/2015 | Akimoto et al. | 257/43 |
| 2001/0046027 | A1 | 11/2001 | Tai et al. | |
| 2002/0056838 | A1 | 5/2002 | Ogawa | |
| 2002/0132454 | A1 | 9/2002 | Ohtsu et al. | |
| 2003/0189401 | A1 | 10/2003 | Kido et al. | |
| 2003/0218222 | A1 | 11/2003 | Wager, III et al. | |
| 2004/0038446 | A1 | 2/2004 | Takeda et al. | |
| 2004/0125277 | A1* | 7/2004 | Kim et al. | 349/106 |
| 2004/0127038 | A1 | 7/2004 | Carcia et al. | |
| 2005/0017302 | A1 | 1/2005 | Hoffman | |
| 2005/0199959 | A1 | 9/2005 | Chiang et al. | |
| 2005/0205921 | A1 | 9/2005 | Ishii et al. | |
| 2006/0035452 | A1 | 2/2006 | Carcia et al. | |
| 2006/0043377 | A1 | 3/2006 | Hoffman et al. | |
| 2006/0091793 | A1 | 5/2006 | Baude et al. | |
| 2006/0108529 | A1 | 5/2006 | Saito et al. | |
| 2006/0108636 | A1 | 5/2006 | Sano et al. | |
| 2006/0110867 | A1 | 5/2006 | Yabuta et al. | |
| 2006/0113536 | A1 | 6/2006 | Kumomi et al. | |
| 2006/0113539 | A1 | 6/2006 | Sano et al. | |
| 2006/0113549 | A1 | 6/2006 | Den et al. | |
| 2006/0113565 | A1 | 6/2006 | Abe et al. | |
| 2006/0169973 | A1 | 8/2006 | Isa et al. | |
| 2006/0170111 | A1 | 8/2006 | Isa et al. | |
| 2006/0197092 | A1 | 9/2006 | Hoffman et al. | |
| 2006/0208977 | A1 | 9/2006 | Kimura | |
| 2006/0228974 | A1 | 10/2006 | Thelss et al. | |
| 2006/0231882 | A1 | 10/2006 | Kim et al. | |
| 2006/0238135 | A1 | 10/2006 | Kimura | |
| 2006/0244107 | A1 | 11/2006 | Sugihara et al. | |
| 2006/0284171 | A1 | 12/2006 | Levy et al. | |
| 2006/0284172 | A1* | 12/2006 | Ishii | 257/43 |
| 2006/0292777 | A1 | 12/2006 | Dunbar | |
| 2007/0024187 | A1 | 2/2007 | Shin et al. | |
| 2007/0046191 | A1 | 3/2007 | Saito | |
| 2007/0052025 | A1 | 3/2007 | Yabuta | |
| 2007/0054507 | A1 | 3/2007 | Kaji et al. | |
| 2007/0090365 | A1 | 4/2007 | Hayashi et al. | |
| 2007/0108446 | A1* | 5/2007 | Akimoto | 257/61 |
| 2007/0152217 | A1 | 7/2007 | Lai et al. | |
| 2007/0165148 | A1* | 7/2007 | Koyama | 349/38 |
| 2007/0172591 | A1 | 7/2007 | Seo et al. | |
| 2007/0187678 | A1 | 8/2007 | Hirao et al. | |
| 2007/0187760 | A1 | 8/2007 | Furuta et al. | |
| 2007/0194379 | A1 | 8/2007 | Hosono et al. | |
| 2007/0252928 | A1 | 11/2007 | Ito et al. | |
| 2007/0272922 | A1 | 11/2007 | Kim et al. | |
| 2007/0287296 | A1 | 12/2007 | Chang | |
| 2008/0006877 | A1 | 1/2008 | Mardilovich et al. | |
| 2008/0038882 | A1 | 2/2008 | Takechi et al. | |
| 2008/0038929 | A1 | 2/2008 | Chang | |
| 2008/0050595 | A1 | 2/2008 | Nakagawara et al. | |
| 2008/0073653 | A1 | 3/2008 | Iwasaki | |
| 2008/0083950 | A1 | 4/2008 | Pan et al. | |
| 2008/0106191 | A1 | 5/2008 | Kawase | |
| 2008/0128689 | A1 | 6/2008 | Lee et al. | |
| 2008/0129195 | A1 | 6/2008 | Ishizaki et al. | |
| 2008/0166834 | A1 | 7/2008 | Kim et al. | |
| 2008/0182358 | A1 | 7/2008 | Cowdery-Corvan et al. | |
| 2008/0224133 | A1 | 9/2008 | Park et al. | |
| 2008/0254569 | A1 | 10/2008 | Hoffman et al. | |
| 2008/0258139 | A1 | 10/2008 | Ito et al. | |
| 2008/0258140 | A1 | 10/2008 | Lee et al. | |
| 2008/0258141 | A1 | 10/2008 | Park et al. | |
| 2008/0258143 | A1 | 10/2008 | Kim et al. | |
| 2008/0296568 | A1 | 12/2008 | Ryu et al. | |
| 2009/0002590 | A1 | 1/2009 | Kimura | |
| 2009/0045397 | A1* | 2/2009 | Iwasaki | 257/43 |
| 2009/0068773 | A1 | 3/2009 | Lai et al. | |
| 2009/0073325 | A1 | 3/2009 | Kuwabara et al. | |
| 2009/0102751 | A1 | 4/2009 | Takatoku | |
| 2009/0114910 | A1 | 5/2009 | Chang | |
| 2009/0134399 | A1 | 5/2009 | Sakakura et al. | |
| 2009/0152506 | A1 | 6/2009 | Umeda et al. | |
| 2009/0152541 | A1 | 6/2009 | Maekawa et al. | |
| 2009/0230390 | A1 | 9/2009 | Gosain et al. | |
| 2009/0239335 | A1* | 9/2009 | Akimoto et al. | 438/104 |
| 2009/0250695 | A1 | 10/2009 | Tanaka et al. | |
| 2009/0278122 | A1 | 11/2009 | Hosono et al. | |

(56) References Cited

U.S. PATENT DOCUMENTS

| | | |
|---|---|---|
| 2009/0280600 A1 | 11/2009 | Hosono et al. |
| 2010/0006833 A1 | 1/2010 | Ha et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0134710 A1 | 6/2010 | Ishitani et al. |
| 2010/0148171 A1 | 6/2010 | Hayashi et al. |
| 2010/0193785 A1 | 8/2010 | Kimura |
| 2010/0276689 A1 | 11/2010 | Iwasaki |
| 2010/0279462 A1 | 11/2010 | Iwasaki |
| 2010/0295042 A1 | 11/2010 | Yano et al. |
| 2011/0065216 A1 | 3/2011 | Kaji et al. |
| 2011/0076790 A1* | 3/2011 | Ofuji et al. ............ 438/17 |
| 2011/0101351 A1 | 5/2011 | Yamazaki |
| 2014/0042443 A1* | 2/2014 | Yamazaki ............ 257/57 |
| 2014/0160385 A1 | 6/2014 | Yamazaki et al. |
| 2014/0312342 A1* | 10/2014 | Yamazaki ............ 257/43 |
| 2014/0326996 A1* | 11/2014 | Yamazaki et al. ......... 257/43 |

FOREIGN PATENT DOCUMENTS

| | | |
|---|---|---|
| CN | 101533857 | 9/2009 |
| CN | 101859711 | 10/2010 |
| EP | 1022786 A | 7/2000 |
| EP | 1031873 A | 8/2000 |
| EP | 1737044 A | 12/2006 |
| EP | 2226847 A | 9/2010 |
| EP | 2284605 A | 2/2011 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-301145 A | 11/1998 |
| JP | 11-505377 | 5/1999 |
| JP | 2000-044236 A | 2/2000 |
| JP | 2000-150900 A | 5/2000 |
| JP | 2000-269457 A | 9/2000 |
| JP | 2000-276076 A | 10/2000 |
| JP | 2000-312005 A | 11/2000 |
| JP | 2001-044297 A | 2/2001 |
| JP | 2001-249362 A | 9/2001 |
| JP | 2002-076356 A | 3/2002 |
| JP | 2002-244153 A | 8/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-246315 A | 9/2004 |
| JP | 2004-273614 A | 9/2004 |
| JP | 2004-273732 A | 9/2004 |
| JP | 2005-164741 A | 6/2005 |
| JP | 2005-202337 A | 7/2005 |
| JP | 2007-103918 A | 4/2007 |
| JP | 2007-115902 A | 5/2007 |
| JP | 2007-201437 A | 8/2007 |
| JP | 2007-212499 A | 8/2007 |
| JP | 2008-270744 A | 11/2008 |
| JP | 2009-043871 A | 2/2009 |
| JP | 2009-081425 A | 4/2009 |
| JP | 2009-099778 A | 5/2009 |
| JP | 2009-135350 A | 6/2009 |
| JP | 2009-224354 A | 10/2009 |
| JP | 2009-237573 A | 10/2009 |
| JP | 2009-253204 A | 10/2009 |
| JP | 2009-267399 A | 11/2009 |
| JP | 2009-277701 | 11/2009 |
| JP | 2010-021520 | 1/2010 |
| JP | 2010-074137 A | 4/2010 |
| JP | 2010-183108 A | 8/2010 |
| KR | 2008-0053355 A | 6/2008 |
| KR | 2009-0039611 A | 4/2009 |
| KR | 2009-0098679 A | 9/2009 |
| WO | WO-00/55920 | 9/2000 |
| WO | WO-2004/114391 | 12/2004 |
| WO | WO-2007/029844 | 3/2007 |
| WO | WO-2009/093625 | 7/2009 |

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irridation With Ultraviolet Lamp,", Journal of Sol-Gel Science and Technology, 2003, vol. 26, pp. 181-184.

(56) References Cited

OTHER PUBLICATIONS

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-363.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Genertaion Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '09 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID Interntional Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A. (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-

(56) References Cited

OTHER PUBLICATIONS

OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 6, pp. 501-515.

Hosono.H et al., "Working hypothesis to explore novel wide band gap electrically conducting amorphous oxides and examples,", J. Non-Cryst. Solids (Journal of Non-Chrystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2011/060683) Dated Jul. 26, 2011.

Written Opinion (Application No. PCT/JP2011/060683) Dated Jul. 26, 2011.

\* cited by examiner

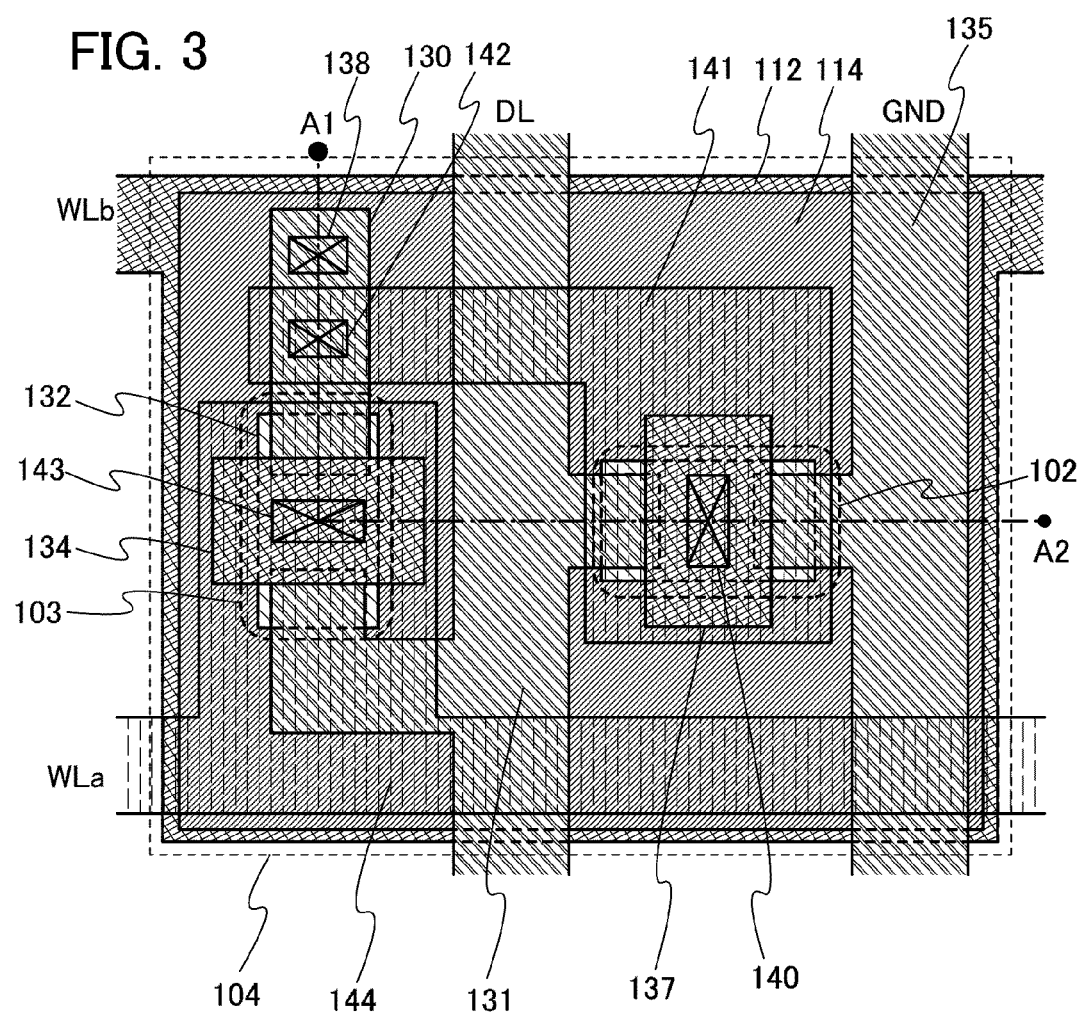

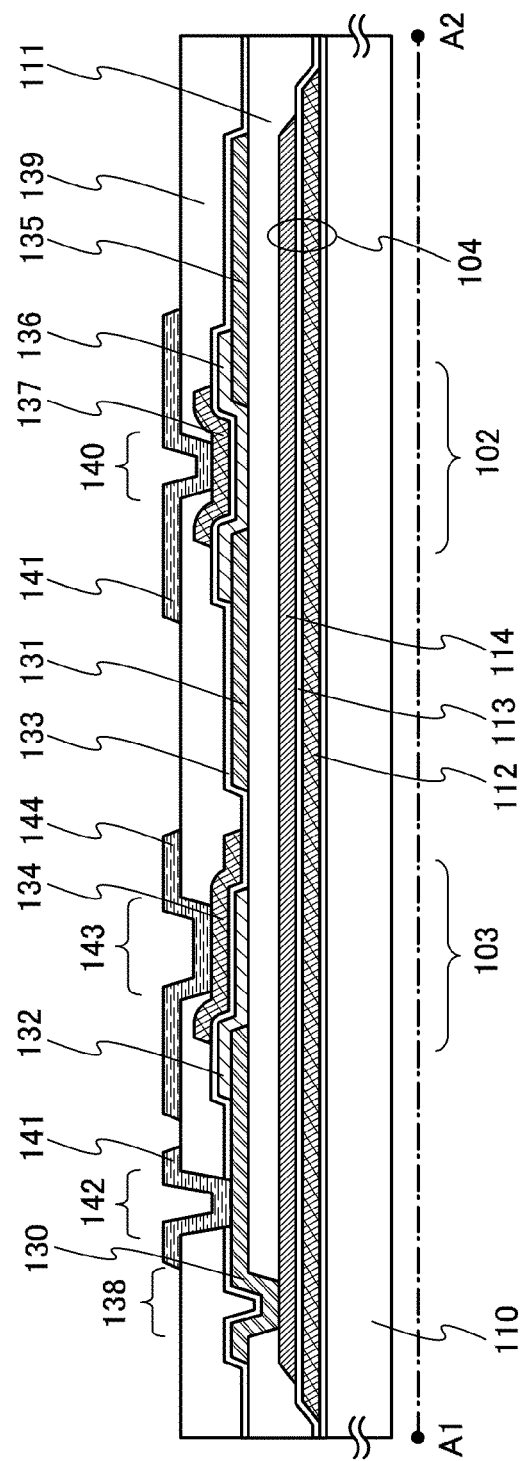

SEMICONDUCTOR DEVICE WITH LIGHT-BLOCKING LAYERS

TECHNICAL FIELD

The present invention relates to a memory device and a semiconductor device including the memory device.

BACKGROUND ART

In recent years, a metal oxide having semiconductor characteristics, which is called an oxide semiconductor, has attracted attention as a novel semiconductor material having high mobility as in the case of polysilicon or microcrystalline silicon and having uniform element characteristics as in the case of amorphous silicon. A metal oxide is used for various applications. For example, indium oxide is a well-known metal oxide and used as a material of a transparent electrode included in a liquid crystal display device or the like. Examples of such metal oxides having semiconductor characteristics include tungsten oxide, tin oxide, indium oxide, and zinc oxide. Insulated-gate field-effect transistors (hereinafter simply referred to as transistors) in each of which such metal oxide having semiconductor characteristics is used for a channel formation region have already been known.

It is known that in a transistor including an oxide semiconductor, degradation of characteristics, such as shifts in the threshold voltage and increase in off-state current, is caused by light, particularly light in the range of the wavelength shorter than that of the visible light, such as ultraviolet light. A transistor used in a semiconductor device desirably has small change in characteristics or small variation caused due to change in characteristics. Therefore, a technique for preventing degradation of characteristics of a transistor, caused by light, has been researched and developed, as disclosed in Patent Document 1 and Patent Document 2.

REFERENCE

Patent Document

[Patent Document 1] Japanese Published Patent Application No. 2010-021520
[Patent Document 2] Japanese Published Patent Application No. 2009-277701

DISCLOSURE OF INVENTION

In the case of a semiconductor memory device in which a transistor including the oxide semiconductor in a channel formation region is used as a switching element (hereinafter simply referred to as a memory device), the threshold voltage of the transistor shifts or off-state current is increased, so that charge to be held in a memory element is easily discharged and a period in which data can be held tends to be shortened. Accordingly, in order to ensure a longer period in which accurate data is held in a memory device, it is important to prevent degradation of characteristics of a transistor due to light irradiation.

Further, in the above memory device, the smaller an area occupied by each memory cell is, the more memory capacity per unit area can be increased. However, as an area occupied by a memory cell is decreased, an area occupied by a capacitor for holding charge of a memory element, which is provided in each memory cell, has to be decreased. Therefore, it is difficult for a capacitor to ensure a capacitance value enough to hold data for a long time in a memory device.

In view of the above problem, an object of the present invention is to propose a memory device in which a period in which data is held is ensured and memory capacity per unit area can be increased. Further, an object of the present invention is to propose a semiconductor device including the memory device.

A memory device according to one embodiment of the present invention includes a transistor serving as a memory element, a transistor including an oxide semiconductor in an active layer for control of accumulating, holding, and discharging charge in the memory element, and a capacitor connected to the memory element. Alternatively, a memory device according to one embodiment of the present invention includes a capacitor serving as a memory element, and a transistor including an oxide semiconductor in a channel formation region for accumulating, holding, and discharging charge in the memory element.

At least one of a pair of electrodes of the capacitor has a light-blocking property. Further, the memory device according to one embodiment of the present invention includes a light-blocking layer such as a light-blocking conductive film or a light-blocking insulating film, and the active layer is provided between the electrode having a light-blocking property and the light-blocking layer.

An oxide semiconductor may also be included in an active layer of the transistor serving as a memory element.

An oxide semiconductor has a band gap approximately three times as large as that of silicon and has the intrinsic carrier density lower than that of silicon. With a channel formation region including a semiconductor material having the above characteristics, a transistor with extremely small off-state current can be realized. The transistor having the above structure is used as a switching element for holding charge accumulated in a memory element, whereby leakage of charge from the memory element can be prevented.

An oxide semiconductor is a metal oxide having semiconductor characteristics, and has mobility approximately as high as microcrystalline or polycrystalline silicon and uniform element characteristics which is a characteristic of amorphous silicon. An oxide semiconductor highly purified (a purified OS) by reduction in concentration of impurities such as moisture or hydrogen, which serves as electron donors (donors), is an i-type semiconductor (an intrinsic semiconductor) or a substantially i-type semiconductor. Therefore, a transistor including the oxide semiconductor has a characteristic of extremely small off-state current. Specifically, the hydrogen concentration in the highly purified oxide semiconductor which is measured by secondary ion mass spectrometry (SIMS) is less than or equal to $5 \times 10^{19}/cm^3$, preferably less than or equal to $5 \times 10^{18}/cm^3$, more preferably less than or equal to $5 \times 10^{17}/cm^3$, still more preferably less than or equal to $1 \times 10^{16}/cm^3$. In addition, the carrier density of the oxide semiconductor film, which is measured by Hall effect measurement, is less than $1 \times 10^{14}/cm^3$, preferably less than $1 \times 10^{12}/cm^3$, more preferably less than $1 \times 10^{11}/cm^3$. Furthermore, the band gap of the oxide semiconductor is 2 eV or more, preferably 2.5 eV or more, more preferably 3 eV or more. With the use of a highly purified oxide semiconductor film with sufficiently reduced concentration of impurities such as moisture or hydrogen, off-state current or leakage current of the transistor can be reduced.

The analysis of the concentration of hydrogen in the oxide semiconductor film is described here. The hydrogen concentration in the oxide semiconductor film and the conductive film is measured by SIMS. It is known to be difficult to obtain accurate data in the proximity of a surface of a sample or in the proximity of an interface between stacked films formed using different materials by the SIMS in principle. Thus, in the case where distributions of the hydrogen concentrations of the films in thickness directions are analyzed by SIMS, an average value in a region where the films are provided, the value is not greatly changed, and almost the same value can be obtained is employed as the hydrogen concentration. Further, in the case where the thickness of the film is small, a region where almost the same value can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

Various experiments can actually prove low off-state current of the transistor including the highly purified oxide semiconductor film as an active layer. For example, even with an element with a channel width of $1\times10^6$ μm and a channel length of 10 μm, in a range of from 1 V to 10 V of voltage (drain voltage) between a source electrode and a drain electrode, it is possible that off-state current (which is drain current in the case where voltage between a gate electrode and the source electrode is 0 V or less) is less than or equal to the measurement limit of a semiconductor parameter analyzer, that is, less than or equal to $1\times10^{-13}$ A. In this case, it can be found that an off-state current density corresponding to a value obtained by dividing the off-state current by the channel width of the transistor is less than or equal to 100 zA/μm. In addition, in an experiment, a circuit where a capacitor is connected to a transistor (whose gate insulating film has a thickness of 100 nm) and charge flowing in or out of the capacitor is controlled by the transistor is used. When a highly purified oxide semiconductor film is used for a channel formation region of the transistor, the off-state current density of the transistor is measured on the basis of change in the amount of charge in the capacitor per unit time. It is found that a lower off-state current density of 10 zA/μm to 100 zA/μm can be obtained in the case where the voltage between the source electrode and the drain electrode of the transistor is 3 V. Therefore, in the semiconductor device according to one embodiment of the present invention, the off-state current density of the transistor including the highly purified oxide semiconductor film as an active layer can be lower than or equal to 10 zA/μm, preferably lower than or equal to 1 zA/μm, more preferably lower than or equal to 1 yA/μm, depending on the voltage between the source electrode and the drain electrode. Accordingly, the transistor including the highly purified oxide semiconductor film as an active layer has much lower off-state current than a transistor including silicon having crystallinity.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor, an In—O-based oxide semiconductor, a Sn—O-based oxide semiconductor, a Zn—O-based oxide semiconductor, or the like can be used. In this specification, for example, an In—Sn—Ga—Zn—O-based oxide semiconductor means a metal oxide including indium (In), tin (Sn), gallium (Ga), and zinc (Zn), whose stoichiometric composition ratio is not particularly limited. The above oxide semiconductor may include silicon.

Alternatively, the oxide semiconductor can be represented by the chemical formula, $InMO_3(ZnO)_m$ (m>0, m is not necessarily a natural number). Here, M represents one or more metal elements selected from Zn, Ga, Al, Mn, and Co. For example, M can be Ga, Ga and Al, Ga and Mn, Ga and Co, or the like.

In one embodiment of the present invention, a transistor in which an oxide semiconductor is included in an active layer is used as a switching element for controlling holding of charge in a memory element, whereby leakage of charge from the memory element can be prevented. Further, the active layer is sandwiched between an electrode and a conductive film or an insulating layer, which have a light-blocking property, so that degradation of characteristics of the transistor due to light can be prevented. Specifically, shifts of the threshold voltage can be suppressed and increase in off-state current can be prevented. Further, in one embodiment of the present invention, the electrode having a light-blocking property is used as an electrode of a capacitor. Therefore, since the capacitor is provided so as to overlap with the transistor in a memory cell, an area occupied by the memory cell can be reduced while an area occupied by the capacitor, or a capacitance value is ensured.

Accordingly, in a memory device according to one embodiment of the present invention, memory capacity per unit area can be increased while a period in which data is held is ensured. Further, in the present invention, the memory device is used in a semiconductor device, so that the reliability of the semiconductor device can be increased and high functionality can be achieved.

BRIEF DESCRIPTION OF DRAWINGS

In the accompanying drawings:
FIG. 3 is a top view of a memory cell;
FIG. 4 is a cross-sectional view of a memory cell.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that the present invention includes, in its category, all the semiconductor devices in which memory devices can be used: for example, integrated circuits such as microprocessors and image processing circuits, RF tags, memory media, and semiconductor display devices. Further, the semiconductor display devices include semiconductor display devices in which circuit elements using semiconductor films are included in pixel portions or driver circuits, such as liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and the like, in its category.

Embodiment 1

Figure 1A:
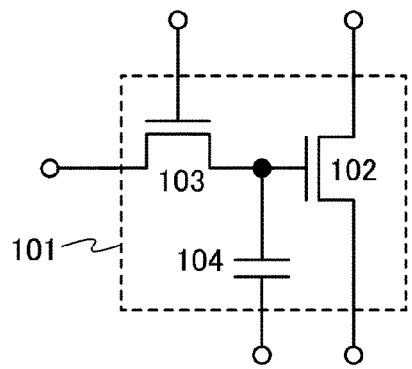
FIGS. 1A to 1D are circuit diagrams and cross-sectional views of a memory cell.

FIG. 1A illustrates a circuit diagram of a structure of a memory cell in a memory device according to one embodiment of the present invention, as an example. In the circuit diagram illustrated in FIG. 1A, a memory cell 101 includes a transistor 102 serving as a memory element, a transistor 103 serving as a switching element, and a capacitor 104. In the transistor 102 serving as a memory element, charge is accumulated in a gate capacitor formed between a gate electrode and an active layer, whereby data is stored.

Note that the memory cell 101 may further include another circuit element such as a transistor, a diode, a resistor, a capacitor, or an inductor as needed.

The terms of the "source electrode" and the "drain electrode" included in the transistor interchange with each other depending on the polarity of the transistor or difference between the levels of potentials applied to the respective electrodes. In general, in an n-channel transistor, an electrode to which a lower potential is applied is called a source electrode, and an electrode to which a higher potential is applied is called a drain electrode. In a p-channel transistor, an electrode to which a lower potential is applied is called a drain electrode, and an electrode to which a higher potential is applied is called a source electrode. Hereinafter, one of a source electrode and a drain electrode is referred to as a first terminal and the other is referred to as a second terminal, and a connection relation of the transistor 102, the transistor 103, and the capacitor 104 included in the memory cell 101 is described.

In the memory cell 101 illustrated in FIG. 1A, a node connected to a first terminal of the transistor 103 is supplied with a potential of a signal including data. Further, a second terminal of the transistor 103 is connected to a gate electrode of the transistor 102. One of a pair of electrodes of the capacitor 104 is connected to the gate electrode of the transistor 102, and the other is connected to a node to which a fixed potential is applied.

Figure 1B:
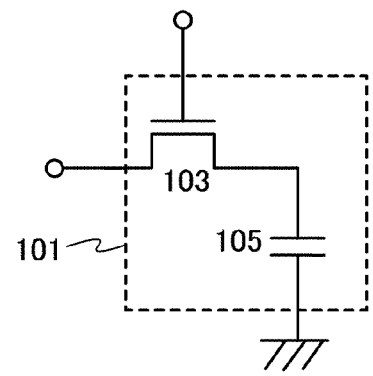

FIG. 1B illustrates a circuit diagram of a structure of a memory cell different from that in FIG. 1A, as an example. In the circuit diagram illustrated in FIG. 1B, the memory cell 101 includes a capacitor 105 serving as a memory element and the transistor 103 serving as a switching element. Charge is accumulated in the capacitor 105 serving as a memory element, whereby data is stored.

In the memory cell 101 illustrated in FIG. 1B, a node connected to the first terminal of the transistor 103 is supplied with a potential of a signal including data. Further, one of a pair of electrodes of the capacitor 105 is connected to the second terminal of the transistor 103, and the other is connected to a node to which a fixed potential is applied.

Note that the term "connection" in this specification refers to electrical connection and corresponds to the state in which current, voltage, or a potential can be supplied or transmitted. Accordingly, a connection state means not only a state of a direct connection but also a state of indirect connection through a circuit element such as a wiring, a resistor, a diode, or a transistor so that current, voltage, or a potential can be supplied or transmitted.

In addition, even when a circuit diagram illustrates independent components connected to each other, there is a case where one conductive film has functions of a plurality of components such as the case where part of a wiring also functions as an electrode. The term "connection" in this specification also means such a case where one conductive film has functions of a plurality of components.

A feature of one embodiment of the present invention is that a channel formation region of the transistor 103 serving as a switching element, which is illustrated in FIG. 1A or FIG. 1B, includes an oxide semiconductor which has band gap wider than the band gap of a silicon semiconductor and has intrinsic carrier density lower than the intrinsic carrier density of silicon. When an oxide semiconductor having the above characteristics is included in a channel formation region, the transistor 103 with extremely small off-state current can be realized. The transistor 103 having the above structure is used as a switching element for holding charge accumulated in the transistor 102 or the capacitor 105 serving as a memory element, so that leakage of the charge can be prevented.

Unless otherwise specified, in the case of an n-channel transistor, off-state current in this specification is current which flows between a source electrode and a drain electrode when a potential of the drain electrode is higher than that of the source electrode and that of a gate electrode while the potential of the gate electrode is less than or equal to zero when a reference potential is the potential of the source electrode. Alternatively, in this specification, in the case of a p-channel transistor, off-state current is current which flows between a source electrode and a drain electrode when a potential of the drain electrode is lower than that of the source electrode and that of a gate electrode while the potential of the gate electrode is greater than or equal to zero when a reference potential is the potential of the source electrode.

As one example of a semiconductor material which has band gap wider than the band gap of a silicon semiconductor and has intrinsic carrier density lower than the intrinsic carrier density of silicon, a compound semiconductor such as silicon carbide (SiC) or a gallium nitride (GaN) can be given as well as an oxide semiconductor. However, a compound semiconductor such as silicon carbide or gallium nitride is required to be a single crystal, and it is difficult to meet the manufacturing condition to obtain a single crystal material; for example, crystal growth at a temperature extremely higher than a process temperature of the oxide semiconductor is needed or epitaxial growth over a special substrate is needed. Such a condition does not allow film formation of any of these compound semiconductors over a silicon wafer that can be obtained easily or a glass substrate whose allowable temperature limit is low. On the contrary, the oxide semiconductor has the advantage that it can be formed by a sputtering method or a wet method (a printing method or the like) and has good mass productivity. Further, an oxide semiconductor can be formed at a room temperature, so that the oxide semiconductor can be formed over a glass substrate, or over an integrated circuit including a semiconductor element, and a larger substrate can be used. Accordingly, among the semiconductors with wide band gaps, the oxide semiconductor particularly has an advantage of high mass productivity. Further, in the case where a crystalline oxide semiconductor is to be obtained in order to improve the performance of a transistor (e.g., field-effect mobility), the crystalline oxide semiconductor can be obtained by heat treatment at 200° C. to 800° C.

Note that in FIG. 1A, an oxide semiconductor film may be used for the active layer of the transistor 102 serving as a memory element. Alternatively, for the active layer of the transistor 102, the following semiconductors other than the oxide semiconductor may be used: amorphous silicon, microcrystalline silicon, polycrystalline silicon, single crystal silicon, amorphous germanium, microcrystalline germanium, polycrystalline germanium, single crystal germanium, or the like. Note that when oxide semiconductor films are used for all of the transistors in the memory cell 101, a manufacturing process can be simplified. Further, for example, the active layer of the transistor 102 serving as a memory element is formed using a semiconductor material such as polycrystalline silicon or single crystal silicon which provides higher mobility than an oxide semiconductor, whereby data can be read from the memory cell 101 at high speed.

Note that in FIG. 1A or FIG. 1B, the transistor 103 has a gate electrode on one side of the active layer. When the transistor 103 has a pair of gate electrodes having the active layer therebetween, a signal for controlling switching is supplied to one of the gate electrodes, and the other of the gate electrodes may be in a floating state (i.e., electrically insulated) or a potential may be supplied to the other of the gate electrodes. In the latter case, potentials with the same level may be applied to the pair of electrodes, or a fixed potential such as a ground potential may be applied only to the other of the gate electrodes. When the level of a potential supplied to the other of the gate electrodes is controlled, the threshold voltage of the transistor 103 can be controlled.

Note that although in FIG. 1B, the memory cell 101 includes one transistor 103 serving as a switching element, the present invention is not limited to this structure. In one embodiment of the present invention, it is acceptable as long as one transistor serving as a switching element is provided in each memory cell, and the number of such transistors may be plural. In the case where the memory cell 101 includes a plurality of transistors serving as switching elements, the plurality of transistors may be connected to each other in parallel, in series, or in combination of parallel connection and series connection.

Note that in this specification, the state in which the transistors are connected to each other in series means, for example, the state in which only one of a first terminal and a second terminal of a first transistor is connected to only one of a first terminal and a second terminal of a second transistor. Further, the state in which the transistors are connected to each other in parallel refers to the state in which the first terminal of the first transistor is connected to the first terminal of the second transistor and the second terminal of the first transistor is connected to the second terminal of the second transistor.

Figure 1C:
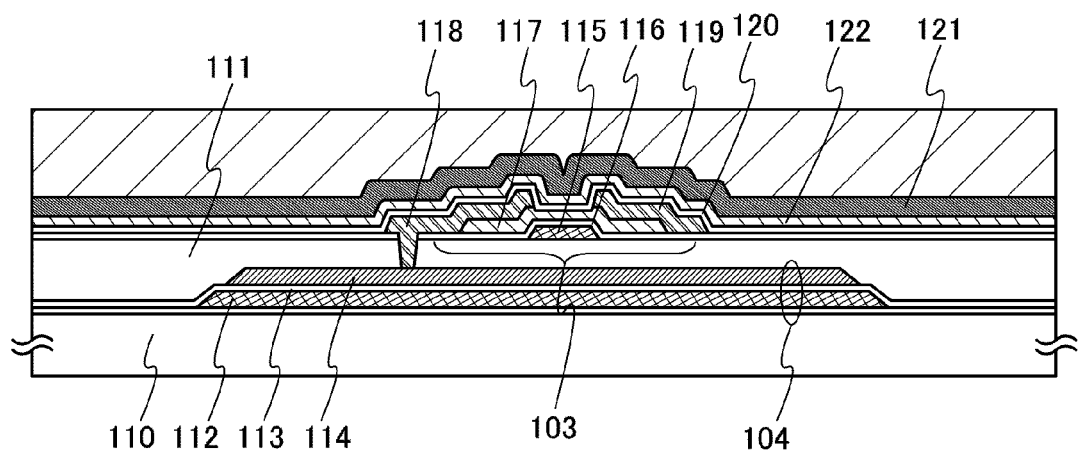

Next, an example of a cross-sectional view of the transistor 103 and the capacitor 104 in FIG. 1A is illustrated in FIG. 1C. Although FIG. 1C illustrates a cross-sectional structure of the memory cell 101 illustrated in FIG. 1A, the transistor 103 and the capacitor 105 in FIG. 1B can have structures similar to those illustrated in FIG. 1C.

In the cross-sectional view illustrated in FIG. 1C, the capacitor 104 and the transistor 103 are formed over a substrate 110 having an insulating surface, and the capacitor 104 and the transistor 103 overlap with each other with an insulating film 111 interposed therebetween.

Specifically, the capacitor 104 includes an electrode 112 formed over the substrate 110 having an insulating surface, an insulating film 113 over the electrode 112, and an electrode 114 which overlaps with the electrode 112 with the insulating film 113 interposed therebetween. A portion in which the electrode 112, the insulating film 113, and the electrode 114 overlap with one another serves as the capacitor 104.

The transistor 103 includes, over the insulating film 111 which covers the electrode 114, a gate electrode 115, an insulating film 116 over the gate electrode 115, an active layer 117 including an oxide semiconductor, which overlaps with the gate electrode 115 with the insulating film 116 interposed therebetween, and a source electrode 118 and a drain electrode 119 over the active layer 117. Further, the transistor 103 may include an insulating film 120 which covers the active layer 117, the source electrode 118, and the drain electrode 119 as a component. The transistor 103 is a bottom-gate transistor having a channel-etched structure in which part of the active layer 117 between the source electrode 118 and the drain electrode 119 is etched.

Note that although FIG. 1C illustrate an example of the case where the transistor 103 has a single-gate structure, the transistor 103 may have a multi-gate structure in which a plurality of electrically connected gate electrodes are included so that a plurality of channel formation regions are included.

In one embodiment of the present invention, as illustrated in FIG. 1C, a light-blocking insulating film 121 is formed so as to cover the transistor 103. Specifically, the insulating film 121 serving as a light-blocking layer is formed so as to overlap with the active layer 117 of the transistor 103.

Note that the light-blocking insulating film or the light-blocking layer used for a wiring or an electrode has low transmittance of light having a wavelength in the vicinity of or shorter than a wavelength at the absorption edge of an oxide semiconductor used in an active layer. Specifically, when the wavelength at the absorption edge is $\lambda_0$, in the light-blocking layer, the transmittance of light having a wavelength longer than or equal to 100 nm and shorter than or equal to $\lambda_0+100$ nm is lower than or equal to 50%, preferably lower than or equal to 30%. For example, in the case where the wavelength at the absorption edge of the active layer 117 formed using an In—Ga—Zn—O-based oxide semiconductor lies at 393 nm, in the light-blocking layer, the transmittance of light having a wavelength longer than or equal to 100 nm and shorter than or equal to 493 nm is lower than or equal to 50%, preferably lower than or equal to 30%. Note that all light in the above wavelength range does not necessarily satisfy the above light transmittance. At least one light in the above wavelength range may satisfy the above range of the light transmittance. Further, it is preferable that the transmittance of light in the longer wavelength side than the above wavelength range satisfy the above range in terms of preventing photo-deterioration of an oxide semiconductor.

For example, the insulating film 121 can be formed using a resin in which black colorant such as carbon black or titanium lower oxide whose oxidation number is smaller than that of titanium dioxide, and an ultraviolet absorber such as titanium dioxide or zinc oxide are dispersed. As a resin, for example, an organic resin such as an acrylic resin, polyimide, a benzocyclobutene resin, polyamide, or an epoxy resin, or a siloxane-based resin can be used. A siloxane-based resin refers to a material in which a skeleton structure is formed by the bond of silicon (Si) and oxygen (O). As well as hydrogen, at least one of fluorine, a fluoro group, and an organic group (e.g., an alkyl group or aromatic hydrocarbon) may be used as a substituent.

Note that in the case where a resin is used for the insulating film 121, an insulating film 122 formed using a material having a high barrier property is preferably formed between the insulating film 121 and the active layer 117 in order to prevent an impurity such as hydrogen or water contained in the resin from entering the active layer 117, the insulating film 116, or an interface between the active layer 117 and another insulating film and its vicinity. As the insulating film 122 having a high barrier property, a silicon nitride film, a silicon nitride oxide film, an aluminum nitride film, an aluminum nitride oxide film, and the like can be given, for example. Note that the characteristics of the transistor 103 are degraded in some cases when the active layer 117 is in direct contact with the insulating film 122 having a high proportion of nitrogen; therefore, as illustrated in FIG. 1C, the insulating film 120 is preferably formed using a silicon oxide film, a silicon oxynitride film, or the like having a low proportion of nitrogen between the active layer 117 and the insulating film 122.

An inorganic material containing oxygen is used for the insulating film 120 in contact with the active layer 117, whereby a structure can be provided, in which oxygen is supplied from the insulating film 120 to the active layer 117 and oxygen deficiency serving as a donor is reduced to satisfy the stoichiometric composition ratio even when the oxygen deficiency is generated in the active layer 117 by heat treatment for reducing moisture or hydrogen. Accordingly, the active layer 117 can be made to be substantially i-type and variation in electrical characteristics of the transistor 103 due to oxygen deficiency can be reduced, which results in improvement of the electrical characteristics.

Moreover, the oxygen deficiency that serves as a donor in the active layer 117 may be reduced by subjecting the active layer 117 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably greater than or equal to 6N (99.9999%), more preferably greater than or equal to 7N (99.99999%) (that is, the impurity concentration in the oxygen is less than or equal to 1 ppm, preferably less than or equal to 0.1 ppm).

Alternatively, oxygen may be added to the active layer 117 by an ion implantation method or an ion doping method to reduce oxygen deficiency serving as a donor. For example, oxygen which is made into a plasma state by a microwave at 2.45 GHz may be added to the active layer 117.

Note that in this specification, an oxynitride refers to a substance which includes more oxygen than nitrogen, and a nitride oxide refers to a substance which includes a more nitrogen than oxygen. For example, silicon oxynitride is a substance including oxygen, nitrogen, silicon, and hydrogen in ranges of greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Furthermore, silicon nitride oxide is a substance including oxygen, nitrogen, silicon, and hydrogen in ranges of greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 30 atomic %, respectively. Note that the above-described ranges are obtained by measurement using Rutherford backscattering spectrometry (RBS) or hydrogen forward scattering (HFS). In addition, the total of the percentages of the constituent elements does not exceed 100 atomic %.

Further, in one embodiment of the present invention, as illustrated in FIG. 1C, at least one of the electrode 112 and the electrode 114 of the capacitor 104 has a light-blocking property. The electrode 112 or the electrode 114 having a light-blocking property is formed in a position overlapping with the active layer 117 of the transistor 103.

With the above structure, the active layer 117 is sandwiched between the electrode 112 or the electrode 114 having a light-blocking property and the light-blocking insulating film 121, so that light having a wavelength in the vicinity of or shorter than the wavelength at the absorption edge of an oxide semiconductor can be prevented from entering the active layer 117.

Figure 1D:
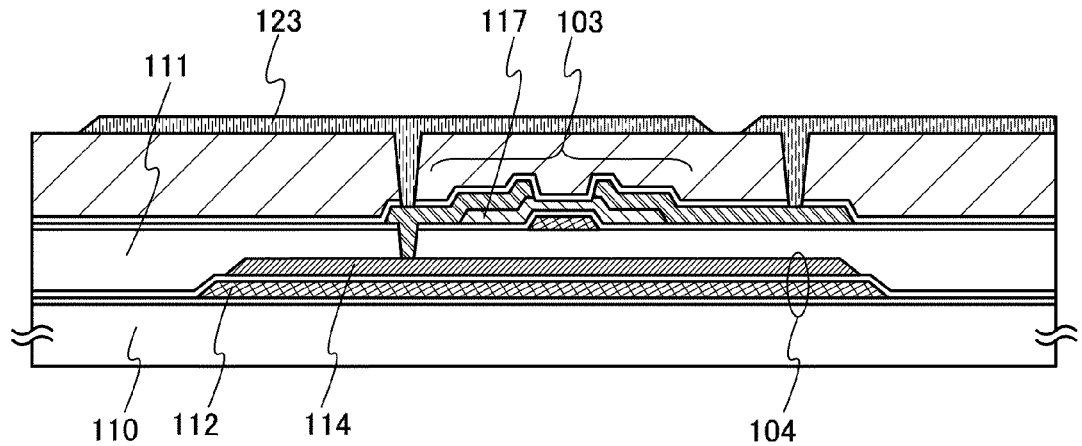

Next, another example of a cross-sectional view of the transistor 103 and the capacitor 104 in FIG. 1A is illustrated in FIG. 1D. Although FIG. 1D illustrates a cross-sectional structure of the memory cell 101 illustrated in FIG. 1A, the transistor 103 and the capacitor 105 in FIG. 1B can have structures similar to those illustrated in FIG. 1D.

In the cross-sectional view illustrated in FIG. 1D, as in FIG. 1C, the capacitor 104 and the transistor 103 are formed over a substrate 110 having an insulating surface, and the capacitor 104 and the transistor 103 overlap with each other with an insulating film 111 interposed therebetween.

Specific structures of the capacitor 104 and the transistor 103 are the same as those illustrated in FIG. 1C. In FIG. 1D, a wiring 123 is formed using a light-blocking conductive film, so that the transistor 103 is cover with the wiring 123. Specifically, the wiring 123 having a light-blocking property is formed so as to overlap with the active layer 117 of the transistor 103.

The characteristic required for the wiring 123 having a light-blocking property is, as described above, low transmittance of light having a wavelength in the vicinity of or shorter than the wavelength at the absorption edge of the oxide semiconductor used for the active layer. Therefore, metal having both conductivity and a light-blocking property is used for the wiring 123. For example, the wiring 123 can be formed using a single layer or a stacked layer of a conductive film including a metal material such as molybdenum, titanium, chromium, tantalum, tungsten, aluminum, copper, neodymium, or scandium, an alloy material which contains any of these metal materials as a main component, or a nitride of any of these metals.

Further, in FIG. 1D, as in FIG. 1C, at least one of the electrode 112 and the electrode 114 of the capacitor 104 has a light-blocking property. The electrode 112 or the electrode 114 having a light-blocking property is formed in a position overlapping with the active layer 117 of the transistor 103.

With the above structure, in FIG. 1D, the active layer 117 is sandwiched between the electrode 112 or the electrode 114 having a light-blocking property and the wiring 123 having a light-blocking property, so that light having a wavelength in the vicinity of or shorter than the wavelength at the absorption edge of an oxide semiconductor can be prevented from entering the active layer 117.

Note that in FIGS. 1C and 1D, the transistor 103 may further include a back gate electrode in a portion over the insulating film 120 which overlaps with a channel formation region of the active layer 117. When the back gate electrode is formed, an insulating film is formed so as to cover the back gate electrode. Further, the back gate electrode may be electrically insulated and in a floating state, or may be in a state where the back gate electrode is supplied with a potential. In the latter case, the back gate electrode may be supplied with a potential having the same level as the gate electrode 115, or may be supplied with a fixed potential such as a ground potential. When the level of a potential supplied to the back gate electrodes is controlled, the threshold voltage of the transistor 103 can be controlled.

Although FIG. 1C and FIG. 1D each illustrate the case where the transistor 103 is a bottom-gate transistor having a channel-etched structure, the structure of the transistor used in one embodiment of the present invention is not limited thereto.

In one embodiment of the present invention, the transistor 103 in which an oxide semiconductor is included in the active layer 117 is used as a switching element for controlling holding of charge in the transistor 102 or the capacitor 105 used as a memory element, whereby leakage of the charge can be prevented. Further, the active layer 117 is sandwiched between layers such as an electrode, a conductive film, and an insulating layer which have a light-blocking property, so that degradation of characteristics of the transistor 103 due to light can be prevented. Specifically, shifts of the threshold voltage can be suppressed and increase in off-state current can be prevented. Further, in one embodiment of the present invention, the electrode having a light-blocking property is used as the electrode 112 or the electrode 114 of the capacitor 104 or the capacitor 105. Therefore, since the capacitor 104 or the capacitor 105 is provided so as to overlap with the transistor 103 in the memory cell 101, an area occupied by the memory cell 101 can be reduced while an area occupied by the capacitor 104 or the capacitor 105, or a capacitance value is ensured.

Accordingly, in a memory device according to one embodiment of the present invention, memory capacity per unit area can be increased while a period in which data is held is ensured. Further, in the present invention, the memory device is used in a semiconductor device, so that the reliability of the semiconductor device can be increased and high functionality can be achieved.

Next, specific examples of a connection structure of wirings in the memory cell 101 are illustrated in FIGS. 2A to 2D.

Figure 2A:
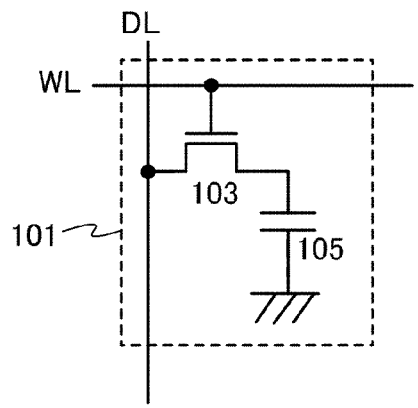
FIGS. 2A to 2D are each a circuit diagram of a memory cell.

A memory cell 101 illustrated in FIG. 2A includes a transistor 103 serving as a switching element and a capacitor 105 serving as a memory element. A gate electrode of the transistor 103 is connected to a word line WL. A first terminal of the transistor 103 is connected to a data line DL, and a second terminal of the transistor 103 is connected to one of electrodes of the capacitor 105. The other of the electrodes of the capacitor 105 is connected to a node to which a fixed potential such as a ground potential is supplied.

In the memory cell 101 illustrated in FIG. 2A, in data writing, the transistor 103 is turned on, so that a potential of a signal including data is supplied from the data line DL to the one of the electrodes of the capacitor 105 through the transistor 103. The amount of charge accumulated in the capacitor 105 is controlled in accordance with the potential of the signal, so that data is written into the capacitor 105.

Next, in data holding, the transistor 103 is turned off, so that the charge is held in the capacitor 105. As described above, the transistor 103 has a characteristic of extremely small off-state current. Therefore, the charge accumulated in the capacitor 105 is difficult to leak, and thus, the data can be held for a long period of time as compared to the case where light is not blocked or the case where a semiconductor material such as silicon is used for the transistor 103.

In data reading, the transistor 103 is turned on, so that the charge accumulated in the capacitor 105 is taken out through the data line DL. The difference in the amount of charge is read, whereby data can be read.

Figure 2B:
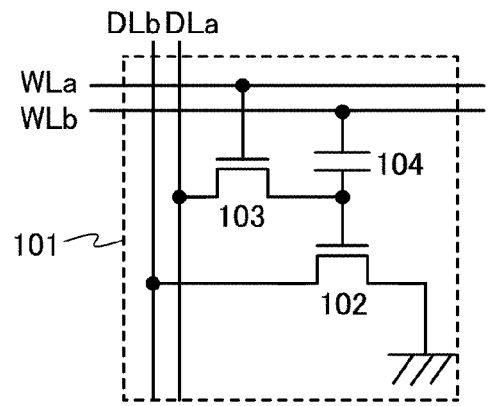

A memory cell 101 illustrated in FIG. 2B includes a transistor 103 serving as a switching element, and a transistor 102 and a capacitor 104 serving as memory elements. A gate electrode of the transistor 103 is connected to a first word line WLa. A first terminal of the transistor 103 is connected to a first data line DLa and a second terminal of the transistor 103 is connected to a gate electrode of the transistor 102. A first terminal of the transistor 102 is connected to a second data line DLb, and a second terminal of the transistor 102 is connected to a node to which a fixed potential such as a ground potential is supplied. As for a pair of electrodes of the capacitor 104, one of the electrodes is connected to the gate electrode of the transistor 102, and the other is connected to a second word line WLb.

In the memory cell 101 illustrated in FIG. 2B, in data writing, the transistor 103 is turned on, so that a potential of a signal including data is supplied from the first data line DLa to the gate electrode of the transistor 102 through the transistor 103. The amount of charge accumulated in a gate capacitance of the transistor 102 and the capacitor 104 is controlled in accordance with the potential of the signal, so that data is written into the transistor 102 and the capacitor 104.

Next, in data holding, the transistor 103 is turned off, so that the charge accumulated in the gate capacitance of the transistor 102 and the capacitor 104 is held. As described above, the transistor 103 has a characteristic of extremely small off-state current. Therefore, the accumulated charge is difficult to leak, and thus, the data can be held for a long period of time as compared to the case where light is not blocked or the case where a semiconductor material such as silicon is used for the transistor 103.

In data reading, a potential of the second word line WLb is changed. The potential difference between the pair of electrodes of the capacitor 104 is kept in accordance with the law of conservation of charge; thus, the change in the potential of the second word line WLb is supplied to the gate electrode of the transistor 102. The threshold voltage of the transistor 102 is changed in accordance with the amount of charge accumulated in the gate capacitance of the transistor 102. The difference in the amount of accumulated charge is read from the amount of drain current of the transistor 102 which is obtained through the change in the potential of the gate electrode of the transistor 102, whereby data can be read.

Figure 2C:
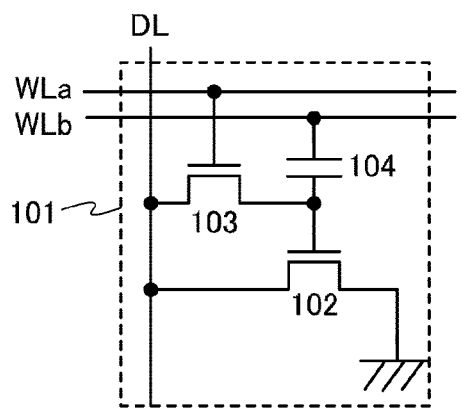

A memory cell 101 illustrated in FIG. 2C is different from the memory cell 101 illustrated in FIG. 2B in that one data line DL has functions of the first data line DLa and the second data line DLb. Specifically, the memory cell 101 illustrated in FIG. 2C includes a transistor 103 serving as a switching element, and a transistor 102 and a capacitor 104 serving as memory elements. A gate electrode of the transistor 103 is connected to a first word line WLa. A first terminal of the transistor 103 is connected to the data line DL, and a second terminal of the transistor 103 is connected to a gate electrode of the transistor 102. A first terminal of the transistor 102 is connected to the data line DL and a second terminal of the transistor 102 is connected to a node to which a fixed potential such as a ground potential is applied. As for a pair of electrodes of the capacitor 104, one of the electrodes is connected to the gate electrode of the transistor 102, and the other is connected to a second word line WLb.

Operation such as data writing, data holding, and data reading can be performed in the memory cell 101 illustrated in FIG. 2C in a manner similar to that in the memory cell 101 illustrated in FIG. 2B.

Figure 2D:
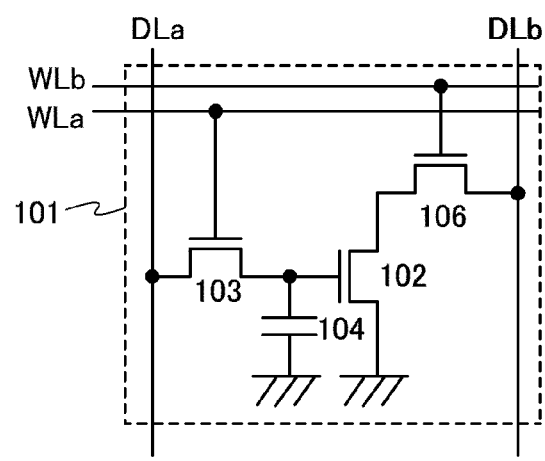

A memory cell 101 illustrated in FIG. 2D includes a transistor 103 serving as a switching element, a transistor 102 and a capacitor 104 serving as memory elements, and a transistor 106 serving as a switching element for controlling data reading. A gate electrode of the transistor 103 is connected to a first word line WLa. A first terminal of the transistor 103 is connected to a first data line DLa, and a second terminal of the transistor 103 is connected to a gate electrode of the transistor 102. A first terminal of the transistor 102 is connected to a second terminal of the transistor 106, and a second terminal of the transistor 102 is connected to a node to which a fixed potential such as a ground potential is supplied. A first terminal of the transistor 106 is connected to a second data line DLb. A gate electrode of the transistor 106 is connected to a second word line WLb. As for a pair of electrodes of the capacitor 104, one of the electrodes is connected to the gate electrode of the transistor 102 and the other is connected to the node to which a fixed potential is applied.

In the memory cell 101 illustrated in FIG. 2D, in data writing, the transistor 103 is turned on, so that a potential of a signal including data is supplied from the first data line DLa to the gate electrode of the transistor 102 through the transistor 103. The amount of charge accumulated in the gate capacitance of the transistor 102 and the capacitor 104 is controlled in accordance with the potential of the signal, so that data is written into the transistor 102 and the capacitor 104.

Next, in data holding, the transistor 103 is turned off, so that the charge accumulated in the gate capacitance of the transistor 102 and the capacitor 104 is held. As described above, the transistor 103 has a characteristic of extremely small off-state current. Therefore, the accumulated charge is difficult to leak, and thus, the data can be held for a long period of time as compared to the case where light is blocked or the case where a semiconductor material such as silicon is used.

In data reading, a potential of the second word line WLb is changed, whereby the transistor 106 is turned on. When the transistor 106 is turned on, drain current having an amount corresponding to the amount of charge accumulated in the gate capacitance of the transistor 102 flows through the transistor 102. The difference in the amount of accumulated charge is read from the amount of the drain current of the transistor 102, whereby data can be read.

Embodiment 2

In this embodiment, one example of a specific structure of a memory cell included in a memory device according to one embodiment of the present invention will be described. Note that in this embodiment, the structure of the memory cell having the circuit structure illustrated in FIG. 2C will be described as an example.

FIG. 3 is an example of a top view of the memory cell. Note that in FIG. 3, an insulating film other than a light-blocking insulating film is omitted in order to clarify the structure of the memory cell. A cross-sectional view taken along dotted line A1-A2 in FIG. 3 is illustrated in FIG. 4.

The memory cell illustrated in FIG. 3 and FIG. 4 includes, over the substrate 110 having an insulating surface, the transistor 102, the transistor 103, and the capacitor 104. The capacitor 104 formed over the substrate 110 is covered with the insulating film 111 and the transistor 102 and the transistor 103 are formed over the insulating film 111. The capacitor 104 overlaps with the transistor 102 and the transistor 103 with the insulating film 111 interposed between the capacitor 104 and the transistors 102 and 103.

Specifically, the capacitor 104 includes the electrode 112 formed over the substrate 110 having an insulating surface, the insulating film 113 over the electrode 112, and the electrode 114 which overlaps with the electrode 112 with the insulating film 113 interposed therebetween. A portion in which the electrode 112, the insulating film 113, and the electrode 114 overlap with one another serves as the capacitor 104.

The transistor 103 includes, over the insulating film 111, a conductive film 130 and a conductive film 131 serving as a source electrode and a drain electrode, an active layer 132 including an oxide semiconductor, which is in contact with the conductive film 130 and the conductive film 131, an insulating film 133 which covers the conductive film 130, the conductive film 131, and the active layer 132, and a gate electrode 134 overlapping with the active layer 132 with the insulating film 133 interposed therebetween.

The transistor 103 illustrated in FIG. 3 and FIG. 4 is a top-gate transistor having a bottom-contact structure in which the conductive film 130 and the conductive film 131 serving as a source electrode and a drain electrode are in contact with a bottom side of the active layer 132.

The transistor 102 includes, over the insulating film 111, the conductive film 131 and a conductive film 135 serving as a source electrode and a drain electrode, an active layer 136 including an oxide semiconductor, which is in contact with the conductive film 131 and the conductive film 135, the insulating film 133 which covers the conductive film 131, the conductive film 135, and the active layer 136, and a gate electrode 137 overlapping with the active layer 136 with the insulating film 133 interposed therebetween.

As in the transistor 103, the transistor 102 illustrated in FIG. 3 and FIG. 4 is a top-gate transistor having a bottom-contact structure in which the conductive film 131 and the conductive film 135 serving as a source electrode and a drain electrode are in contact with a bottom side of the active layer 136.

Although FIG. 3 and FIG. 4 illustrate an example of the case where the transistor 102 and the transistor 103 have a single-gate structure, the transistor 102 and the transistor 103 may have a multi-gate structure in which a plurality of electrically connected gate electrodes are included so that a plurality of channel formation regions are included.

The conductive film 130 is in contact with the electrode 114 through a contact hole 138 formed in the insulating film 111.

Further, an insulating film 139 is formed so as to cover the transistor 102 and the transistor 103. A light-blocking conductive film 141 which is connected to the gate electrode 137 of the transistor 102 through a contact hole 140 formed in the insulating film 139 is formed over the insulating film 139. The conductive film 141 is connected to the conductive film 130 through a contact hole 142 formed in the insulating film 139 and the insulating film 133. A light-blocking conductive film 144 which is connected to the gate electrode 134 of the transistor 103 through a contact hole 143 formed in the insulating film 139 is formed over the insulating film 139.

The light-blocking conductive film 141 is formed in a position overlapping with at least part of the active layer 136 of the transistor 102. Note that it is preferable to completely cover the entire active layer 136 with the conductive film 141 in order to prevent much light from entering the active layer 136.

Further, the light-blocking conductive film 144 is formed in a position overlapping with at least part of the active layer 132 of the transistor 103. Note that it is preferable to completely cover the entire active layer 132 with the conductive film 144 in order to prevent much light from entering the active layer 132.

Further, in one embodiment of the present invention, at least one of the electrode 112 and the electrode 114 of the capacitor 104 has a light-blocking property. The electrode 112 or the electrode 114 having a light-blocking property is formed in a position overlapping with the active layer 132 of the transistor 103 and the active layer 136 of the transistor 102. At least part of the active layer 132 and part of the active layer 136 may overlap with the electrode 112 or the electrode 114. It is preferable that the entire active layer 132 or the entire active layer 136 completely overlap with the electrode 112 or the electrode 114 in order to prevent much light from entering the active layer 132 or the active layer 136.

The characteristics required for the electrode 112, the electrode 114, the conductive film 141, and the conductive film 144 having a light-blocking property are, as described above, low transmittance of light having a wavelength in the vicinity of or shorter than the wavelength at the absorption edge of the oxide semiconductor used for the active layer. Therefore, metal having both conductivity and a light-blocking property is used for each of the electrode 112, the electrode 114, the conductive film 141, and the conductive film 144. For example, the electrode 112 and the electrode 114 can be formed using a single layer or a stacked layer of a conductive film including a metal material such as molybdenum, titanium, chromium, tantalum, tungsten, neodymium, or scandium, or an alloy material which contains any of these metal materials as a main component, or a nitride of any of these metals. Aluminum or copper can also be used for the conductive film 141 and the conductive film 144 in addition to the above materials. In the case where aluminum or copper is used for the conductive film 141 or the conductive film 144, aluminum or copper is preferably used in combination with a refractory metal material in order to avoid problems of heat resistance and corrosion. As the refractory metal material, molybdenum, titanium, chromium, tantalum, tungsten, neodymium, scandium, or the like can be used.

For example, as a two-layer structure of the gate electrode 112, the electrode 114, the conductive film 141, or the conductive film 144, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the electrode 112, the electrode 114, the conductive film 141, or the conductive film 144, the following structure is preferable: a stacked structure in which an aluminum film, an alloy film of aluminum and silicon, an alloy film of aluminum and titanium, or an alloy film of aluminum and neodymium is used as an intermediate layer and sandwiched between two films selected from a tungsten film, a tungsten nitride film, a titanium nitride film, or a titanium film.

The thicknesses of the electrode 112, the electrode 114, the conductive film 141, and the conductive film 144 are each 10 nm to 400 nm, for example, preferably 100 nm to 200 nm.

In one embodiment of the present invention, with the above structure, the active layer 136 is sandwiched between the electrode 112 or the electrode 114 having a light-blocking property and the light-blocking conductive film 141, so that light having a wavelength in the vicinity of or shorter than the wavelength at the absorption edge of an oxide semiconductor can be prevented from entering the active layer 136. Further, the active layer 132 is sandwiched between the electrode 112 and the electrode 114 having a light-blocking property and the light-blocking conductive film 144, so that light having a wavelength in the vicinity of or shorter than the wavelength at the absorption edge of an oxide semiconductor can be prevented from entering the active layer 132.

Note that although a structure in which the active layer 132 and the active layer 136 are shielded from light by the conductive film 141 and the conductive film 144 serving as wirings is illustrated in FIG. 3 and FIG. 4 as an example, as in the structure illustrated in FIG. 1C, the active layer 132 and the active layer 136 may be shielded from light by a light-blocking insulating film.

Although the case where the transistor 102 serving as a memory element includes an oxide semiconductor in the active layer 136 is illustrated in FIG. 3 and FIG. 4 as an example, the transistor 102 does not necessarily include an oxide semiconductor in an active layer. For example, in the case where an active layer of the transistor 102 is formed using a semiconductor material such as silicon or germanium, both the active layer and the capacitor 104 can be formed over one insulating surface. Further, the electrode 112 of the capacitor 104 can be formed using a semiconductor material such as silicon or germanium, similarly to the active layer.

The electrode 112 also serves as the second word line WLb. The conductive film 144 also serves as the first word line WLa. The conductive film 131 also serves as the data line DL. The conductive film 135 serves as the wiring to which a fixed potential such as a ground potential is applied.

Although there is no particular limitation on a material which can be used for the substrate 110, the material needs to have at least heat resistance high enough to withstand heat treatment in manufacturing steps. For example, a glass substrate manufactured by a fusion method or a float method, a quartz substrate, a ceramic substrate, or the like can be used as the substrate 110. In the case where the temperature of heat treatment performed later is high, a glass substrate having a strain point of higher than or equal to 730° C. is preferably used. Although a substrate formed of a flexible synthetic resin such as plastic generally has a lower resistance temperature than the aforementioned substrates, it may be used as long as being resistant to a process temperature during manufacturing steps.

The insulating film 133 is formed to have a single-layer structure or a stacked-layer structure of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a tantalum oxide film by a plasma CVD method, a sputtering method, or the like. It is preferable that the insulating film 133 serving as a gate insulating film include impurities such as moisture, hydrogen, or oxygen as little as possible. In the case of forming a silicon oxide film by a sputtering method, a silicon target or a quartz target is used as a target, and oxygen or a mixed gas of oxygen and argon is used as a sputtering gas.

The oxide semiconductor which becomes i-type or becomes substantially i-type (an oxide semiconductor which is highly purified) by removal of an impurity is extremely sensitive to an interface state or an interface electric charge; therefore, an interface between the highly purified oxide semiconductor and the gate insulating film is important. Therefore, the gate insulating film (GI) that is in contact with the highly purified oxide semiconductor needs to have higher quality.

For example, a high-density plasma CVD method using microwaves (with a frequency of 2.45 GHz) is suitable for a method for forming the insulating film 133 because a dense insulating film which has high breakdown voltage and high quality can be formed. The highly purified oxide semiconductor and the high-quality gate insulating film are in close contact with each other, whereby the interface state can be reduced and interface characteristics can be improved.

If the insulating film 133 that is favorable as a gate insulating film can be formed, other film formation methods such as a sputtering method and a plasma CVD method can be employed. In addition, any insulating film can be used as long as film quality and characteristics of an interface with an oxide semiconductor are improved by heat treatment performed after deposition. In any case, any insulating film that has a reduced interface state density between a gate insulating film and the oxide semiconductor and can form a favorable interface as well as having a favorable film quality as the gate insulating film can be used.

An inorganic material containing oxygen is used for the insulating film 133, whereby a structure can be provided, in which oxygen is supplied from the insulating film 133 to the active layer 132 and the active layer 136 and oxygen deficiency serving as a donor is reduced to satisfy the stoichiometric composition ratio even when the oxygen deficiency is generated in the active layer 132 and the active layer 136 by heat treatment for reducing moisture or hydrogen. Accordingly, the active layer 132 and the active layer 136 can be made to be substantially i-type and variation in electrical characteristics of the transistors due to oxygen deficiency can be reduced, which results in improvement of the electrical characteristics.

An oxide semiconductor film used for the active layer 132 or the active layer 136 has a thickness greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is formed by a sputtering method using an oxide semiconductor as a target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

As described above, as the oxide semiconductor film, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor, an In—O-based oxide semiconductor, a Sn—O-based oxide semiconductor, a Zn—O-based oxide semiconductor, or the like can be used.

For example, in the case where a thin film of an In—Ga—Zn—O-based oxide semiconductor formed by a sputtering method is used as the oxide semiconductor film, a target having a composition ratio of $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio], or a target having a composition ratio of $In_2O_3:Ga_2O_3:ZnO=1:1:4$ [molar ratio] can be used. The filling rate of the target including In, Ga, and Zn is greater than or equal to 90% and less than or equal to 100%, preferably greater than or equal to 95% and less than 100%. With the use of the target with high filling rate, a dense oxide semiconductor film is formed.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 2:1 in a molar ratio), further preferably In:Zn=1.5:1 to 15:1 in an atomic ratio ($In_2O_3$:ZnO=3:4 to 15:2 in a molar ratio). For example, when a target used for forming the In—Zn—O-based oxide semiconductor has an atomic ratio of In:Zn:O=X:Y:Z, Z>1.5X+Y. The ratio of Zn is within the above range, whereby improvement in mobility can be realized.

Note that the oxide semiconductor film formed by sputtering or the like includes a large amount of moisture or hydrogen as an impurity in some cases. Moisture or hydrogen easily forms a donor level and thus serves as an impurity in the oxide semiconductor. Therefore, in one embodiment of the present invention, heat treatment is performed on the oxide semiconductor film in an atmosphere of nitrogen, oxygen, ultra-dry air, or a rare gas (argon, helium, or the like) in order to reduce an impurity such as moisture or hydrogen in the oxide semiconductor film. It is desirable that the content of water in the gas be 20 ppm or less, preferably 1 ppm or less, more preferably 10 ppb or less.

By performing heat treatment on the oxide semiconductor film, moisture or hydrogen in the oxide semiconductor film can be eliminated. Specifically, heat treatment may be performed at higher than or equal to 300° C. and lower than or equal to 700° C., preferably higher than or equal to 300° C. and lower than or equal to 500° C. For example, heat treatment may be performed at 500° C. for approximately longer than or equal to three minutes and shorter than or equal to six minutes. When an RTA method is used for the heat treatment, dehydration or dehydrogenation can be performed in a short time; therefore, treatment can be performed even at a temperature higher than the strain point of a glass substrate.

In addition to the electric furnace, an apparatus for heating an object by heat conduction or heat radiation from a heater such as a resistance heater may be used as the heat treatment apparatus. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

Through the above heat treatment, the hydrogen concentration in the oxide semiconductor film can be reduced and the oxide semiconductor film can be highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, the transistor 102 and the transistor 103 can be manufactured using a large-sized substrate, so that the productivity can be increased. Further, by using the oxide semiconductor film in which the hydrogen concentration is reduced and the purity is improved, it is possible to manufacture the transistor 102 and the transistor 103 with high withstand voltage and extremely small off-state current.

Note that in the case where the oxide semiconductor film is heated, although depending on a material of the oxide semiconductor film or heating conditions, plate-like crystals are formed at the surface of the oxide semiconductor film in some cases. The plane-like crystals are preferably single crystal bodies which are c-axis-aligned in a direction substantially perpendicular to a surface of the oxide semiconductor film. Even if the plate-like crystals are not single crystal bodies, each crystal is preferably a polycrystalline body which is c-axis-aligned in a direction substantially perpendicular to the surface of the oxide semiconductor film. Further, it is preferable that the polycrystalline bodies be c-axis-aligned and that the a-b planes of crystals correspond, or the a-axis or the b-axis of the crystals be aligned with each other. Note that when a base surface of the oxide semiconductor film is uneven, a plate-like crystal is a polycrystalline body. Therefore, the base surface is preferably as flat as possible.

In one embodiment of the present invention, the transistor 103 in which an oxide semiconductor is included in the active layer 132 is used as a switching element for controlling holding of charge in the transistor 102 or the capacitor 104 used as a memory element, whereby leakage of the charge can be prevented. Further, the active layer 132 is sandwiched between light-blocking layers such as an electrode, a conductive film, and an insulating layer which have a light-blocking property, so that degradation of characteristics of the transistor 103 due to light can be prevented. Specifically, shifts of the threshold voltage can be suppressed and increase in off-state current can be prevented. Further, in one embodiment of the present invention, the electrode having a light-blocking property is used as the electrode 112 or the electrode 114 of the capacitor 104. Therefore, since the capacitor 104 is provided so as to overlap with the transistor 103 in the memory cell 101, an area occupied by the memory cell 101 can be reduced while an area occupied by the capacitor 104 or a capacitance value is ensured.

Accordingly, in a memory device according to one embodiment of the present invention, memory capacity per unit area can be increased while a period in which data is held is ensured. Further, in the present invention, the memory device is used in a semiconductor device, so that the reliability of the semiconductor device can be increased and high functionality can be achieved.

This embodiment can be implemented in combination with any of the above embodiments as appropriate.

Embodiment 3

In this embodiment, an example of a structure of the transistor 103 serving as a switching element, which is different from the structure illustrated in FIG. 1D, will be described.

Figure 5A:
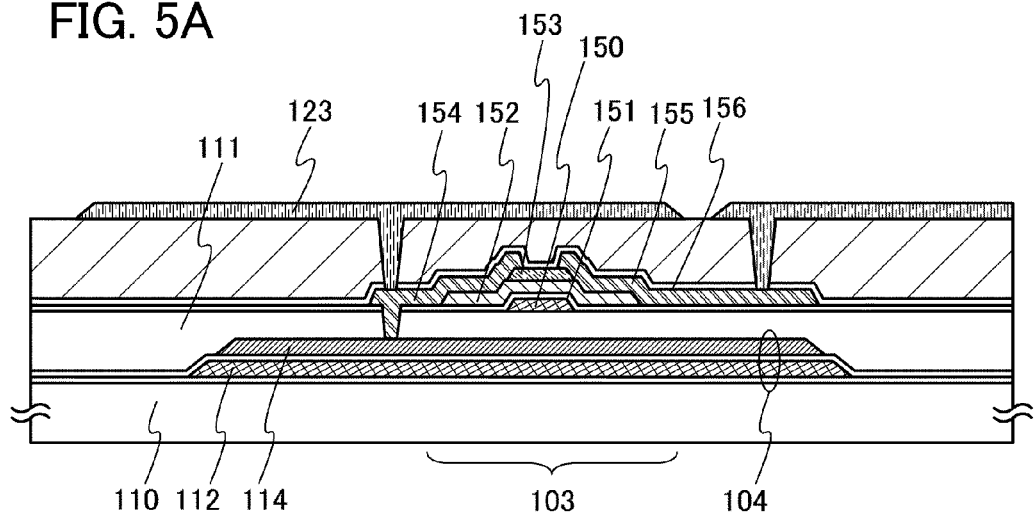
FIGS. 5A and 5B are each a cross-sectional view of a memory cell.

An example of a cross-sectional view of the transistor 103 and the capacitor 104 is illustrated in FIG. 5A. Although FIG. 5A illustrates a cross-sectional structure of the memory cell 101 illustrated in FIG. 1A, the transistor 103 and the capacitor 105 in FIG. 1B can have structures similar to those illustrated in FIG. 5A.

In the cross-sectional view illustrated in FIG. 5A, as in FIG. 1D, the capacitor 104 and the transistor 103 are formed over the substrate 110 having an insulating surface, and the capacitor 104 and the transistor 103 overlap with each other with the insulating film 111 interposed therebetween.

A specific structure of the capacitor 104 is the same as that illustrated in FIG. 1D. FIG. 5A is different from FIG. 1D in that the transistor 103 has a channel protective structure.

The transistor 103 illustrated in FIG. 5A includes a gate electrode 150 over the insulating film 111, an insulating film 151 over the gate electrode 150, an active layer 152 including an oxide semiconductor, which overlaps with the gate electrode 150 over the insulating film 151, a channel protective film 153 formed over the active layer 152 in a position overlapping with the gate electrode 150, and a source electrode 154 and a drain electrode 155 formed over the active layer 152. Further, the transistor 103 may include an insulating film 156 formed over the source electrode 154, the drain electrode 155, the channel protective film 153, and the active layer 152 as a component.

The channel protective film 153 can prevent a portion of the active layer 152 which is to be a channel formation region, from being damaged in a later step, for example, reduction in thickness due to plasma or an etchant in etching. Therefore, reliability of the transistor can be improved.

An inorganic material containing oxygen is used for the channel protective film 153, whereby a structure can be provided, in which oxygen is supplied from the channel protective film 153 to the active layer 152 and oxygen deficiency serving as a donor is reduced to satisfy the stoichiometric composition ratio even when the oxygen deficiency is generated in the active layer 152 by heat treatment for reducing moisture or hydrogen. Accordingly, the active layer 152 can be made to be substantially i-type and variation in electrical characteristics of the transistor due to oxygen deficiency can be reduced, which results in improvement of the electrical characteristics.

Note that the transistor 103 may further include a back gate electrode over the insulating film 156. The back gate electrode is formed to overlap with a channel formation region of the active layer 152. The back gate electrode may be electrically insulated and in a floating state, or may be in a state where the back gate electrode is supplied with a potential. In the latter case, the back gate electrode may be supplied with a potential having the same level as the gate electrode 150, or may be supplied with a fixed potential such as a ground potential. When the level of a potential supplied to the back gate electrode is controlled, the threshold voltage of the transistor 103 can be controlled.

FIG. 5A is the same as FIG. 1D in that the wiring 123 is formed using a light-blocking conductive film to cover the transistor 103. Specifically, the wiring 123 having a light-blocking property is formed so as to overlap with the active layer 152 of the transistor 103.

Further, in FIG. 5A, as in FIG. 1D, at least one of the electrode 112 and the electrode 114 of the capacitor 104 has a light-blocking property. The electrode 112 or the electrode 114 having a light-blocking property is formed in a position overlapping with the active layer 152 of the transistor 103.

With the above structure, in FIG. 5A, the active layer 152 is sandwiched between the electrode 112 or the electrode 114 having a light-blocking property and the wiring 123 having a light-blocking property, so that light having a wavelength in the vicinity of or shorter than the wavelength at the absorption edge of an oxide semiconductor can be prevented from entering the active layer 152.

Further, another example of the structure of the transistor 103 serving as a switching element, which is different from the structure illustrated in FIG. 1D, will be described.

Figure 5B:
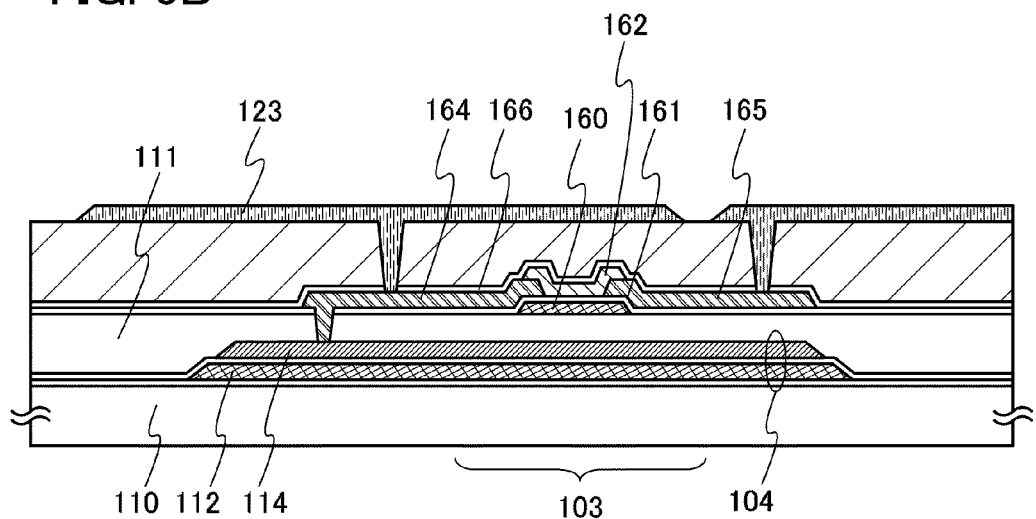

An example of a cross-sectional view of the transistor 103 and the capacitor 104 is illustrated in FIG. 5B. Although FIG. 5B illustrates a cross-sectional structure of the memory cell 101 illustrated in FIG. 1A, the transistor 103 and the capacitor 105 in FIG. 1B can have structures similar to those illustrated in FIG. 5B.

In the cross-sectional view illustrated in FIG. 5B, as in FIG. 1D, the capacitor 104 and the transistor 103 are formed over the substrate 110 having an insulating surface, and the capacitor 104 and the transistor 103 overlap with each other with the insulating film 111 interposed therebetween.

A specific structure of the capacitor 104 is the same as that illustrated in FIG. 1D. FIG. 5B is different from FIG. 1D in that the transistor 103 is a bottom-gate transistor having a bottom-contact structure in which a source electrode and a drain electrode is in contact with a bottom side of an active layer.

The transistor 103 illustrated in FIG. 5B includes a gate electrode 160 over the insulating film 111, an insulating film 161 over the gate electrode 160, a source electrode 164 and a drain electrode 165 formed over the insulating film 161, and an active layer 162 including an oxide semiconductor, which is formed over the insulating film 161 in a position overlapping with the gate electrode 160 and in contact with the source electrode 164 and the drain electrode 165. Further, the transistor 103 may include an insulating film 166 formed over the source electrode 164, the drain electrode 165, and the active layer 162 as a component.

An inorganic material containing oxygen is used for the insulating film 166 which is in contact with the active layer 162, whereby a structure can be provided, in which oxygen is supplied from the insulating film 166 to the active layer 162 and oxygen deficiency serving as a donor is reduced to satisfy the stoichiometric composition ratio even when the oxygen deficiency is generated in the active layer 162 by heat treatment for reducing moisture or hydrogen. Accordingly, the active layer 162 can be made to be substantially i-type and variation in electrical characteristics of the transistor 103 due to oxygen deficiency can be reduced, which results in improvement of the electrical characteristics.

Note that the transistor 103 may further include a back gate electrode over the insulating film 166. The back gate electrode is formed to overlap with a channel formation region of the active layer 162. The back gate electrode may be electrically insulated and in a floating state, or may be in a state where the back gate electrode is supplied with a potential. In the latter case, the back gate electrode may be supplied with a potential having the same level as the gate electrode 160, or may be supplied with a fixed potential such as a ground potential. When the level of a potential supplied to the back gate electrode is controlled, the threshold voltage of the transistor 103 can be controlled.

FIG. 5B is the same as FIG. 1D in that the wiring 123 is formed using a light-blocking conductive film to cover the transistor 103. Specifically, the wiring 123 having a light-blocking property is formed so as to overlap with the active layer 162 of the transistor 103.

Further, in FIG. 5B, as in FIG. 1D, at least one of the electrode 112 and the electrode 114 of the capacitor 104 has a light-blocking property. The electrode 112 or the electrode 114 having a light-blocking property is formed in a position overlapping with the active layer 162 of the transistor 103.

With the above structure, in FIG. 5B, the active layer 162 is sandwiched between the electrode 112 or the electrode 114 having a light-blocking property and the wiring 123 having a light-blocking property, so that light having a wavelength in the vicinity of or shorter than the wavelength at the absorption edge of an oxide semiconductor can be prevented from entering the active layer 162.

Note that although the structure in which the active layer 152 or the active layer 162 is shielded from light by the wiring 123 is illustrated as an example in FIG. 5A or 5B, as illustrated in FIG. 1C, the active layer 152 or the active layer 162 may be shielded from light by a light-blocking insulating film.

Although FIGS. 5A and 5B illustrate examples of the case where the transistor 103 has a single-gate structure, the transistor 103 may have a multi-gate structure in which a plurality of electrically connected gate electrodes are included so that a plurality of channel formation regions are included.

This embodiment can be implemented in combination with any of the above embodiments as appropriate.

Embodiment 4

In this embodiment, a specific structure of a memory portion and operation thereof will be described.

Figure 6:
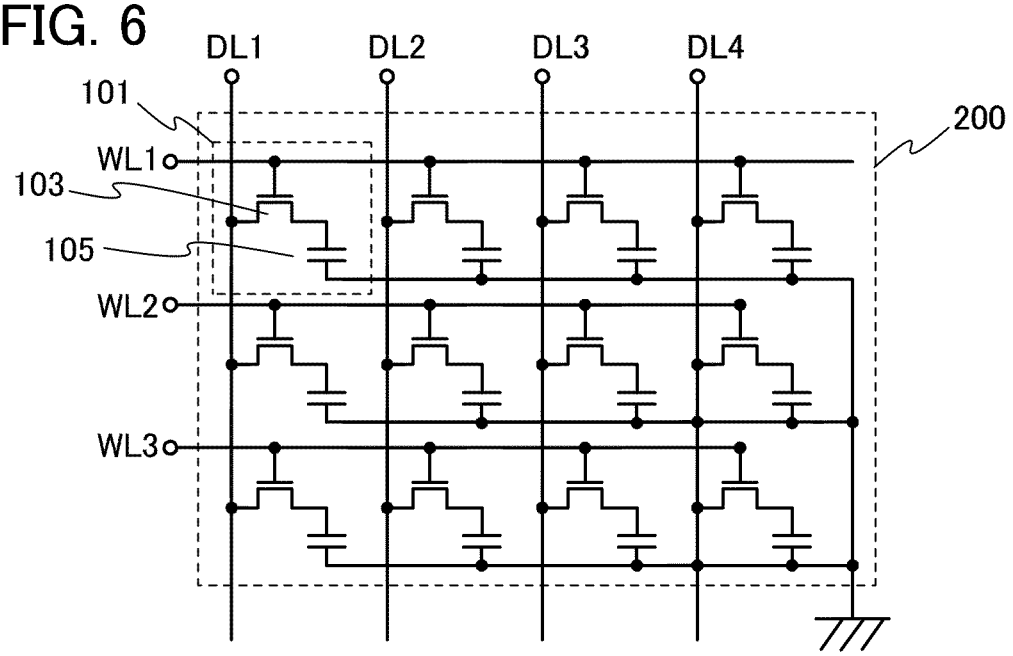
FIG. 6 is a circuit diagram of a memory portion.

FIG. 6 illustrates an example of a circuit diagram of a memory portion 200 including a plurality of memory cells 101 one of which is illustrated in FIG. 2A. For the structure of the memory cell 101, the description in Embodiment 1 can be referred to.

In the memory portion 200 illustrated in FIG. 6, a variety of wirings such as a plurality of word lines WL and a plurality of data lines DL is provided, and a signal or a fixed potential from a driver circuit is supplied to each of the memory cells 101 through the wirings. Therefore, the number of the wirings can be determined in accordance with the number of the memory cells 101 and arrangement of the memory cells 101.

Specifically, the memory portion 200 illustrated in FIG. 6 is an example in which memory cells are connected in a matrix with three rows and four columns and word lines WL1 to WL3 and data lines DL1 to DL4 are arranged.

Next, the operation of the memory portion 200 illustrated in FIG. 6 is described.

First, the operation of the memory portion 200 in data writing is described. In data writing, when a signal with a pulse is input to the word line WL1, the potential of the pulse, specifically, a high-level potential, is supplied to a gate electrode of each transistor 103 connected to the word line WL1. Thus, each transistor 103 whose gate electrode is connected to the word line WL1 is turned on.

Then, signals including data are input to the data lines DL1 to DL4. Needless to say, the levels of the potentials of the signals input to the data lines DL1 to DL4 are varied depending on data. A potential input to each of the data lines DL1 to DL4 is supplied, through each transistor 103 which is on, to one of electrodes of a capacitor 105. The amount of charge accumulated in the capacitor 105 is controlled in accordance with the potential of the signal, so that data is written into the capacitor 105.

When the input of the signal with the pulse to the word line WL1 is finished, each transistor 103 whose gate electrode is connected to the word line WL1 is turned off. Then, signals with pulses are sequentially input to the word line WL2 and the word line WL3, and the above-described operation is similarly performed in memory cells 101 with the word line WL2 and memory cells 101 with the word line WL3.

Then, the operation of the memory portion 200 in data holding is described. In data holding, potentials with levels at which the transistor 103 is turned off, specifically, low-level potentials, are supplied to all of the word lines WL1 to WL3. Since the transistor 103 has extremely small off-state current as described above, charge accumulated in the capacitor 105 is difficult to leak, and thus, the data can be held for a long period of time as compared to the case where light is not blocked or the case where a semiconductor material such as silicon is used for the transistor 103.

Then, the operation of the memory portion 200 in data reading is described. In data reading, signals with pulses are sequentially input to the word lines WL1 to WL3 in a manner similar to that in data writing. When the potential of the pulse, specifically, a high-level potential, is supplied to a gate electrode of each transistor 103 connected to the word line WL1, each transistor 103 connected to the word line WL1 is turned on.

When each transistor 103 connected to the word line WL1 is turned on, charge accumulated in the capacitor 105 is taken out through the data lines DL. The difference in the amount of charge is read, whereby data can be read.

Note that a reading circuit is connected to an end of each data line DL, and a signal output from the reading circuit includes data which is actually read from the memory portion.

Although in this embodiment, a driving method in which writing, holding, and reading of data are sequentially performed in a plurality of memory cells 101 is described, the present invention is not limited to this structure. Only a memory cell 101 with the specified address may perform the above operation.

FIG. 6 illustrates, as an example, the memory portion 200 in which three wirings including the data line DL, the word line WL, and a wiring for supplying a fixed potential to an electrode of the capacitor 105 are connected to each memory cell 101. However, in one embodiment of the present invention, the number of wirings included in each memory cell is not limited to this. The number of wirings and the connection structure may be determined as appropriate so that a signal for controlling switching of the transistor 103, a signal for controlling the amount of charge of the capacitor 105, and a fixed potential can be supplied to each memory cell 101 and a potential including the amount of charge accumulated in the capacitor 105 as data can be transmitted to the driver circuit.

This embodiment can be implemented in combination with any of the above embodiments as appropriate.

Embodiment 5

In this embodiment, a specific structure of a memory portion and operation thereof will be described.

Figure 7:
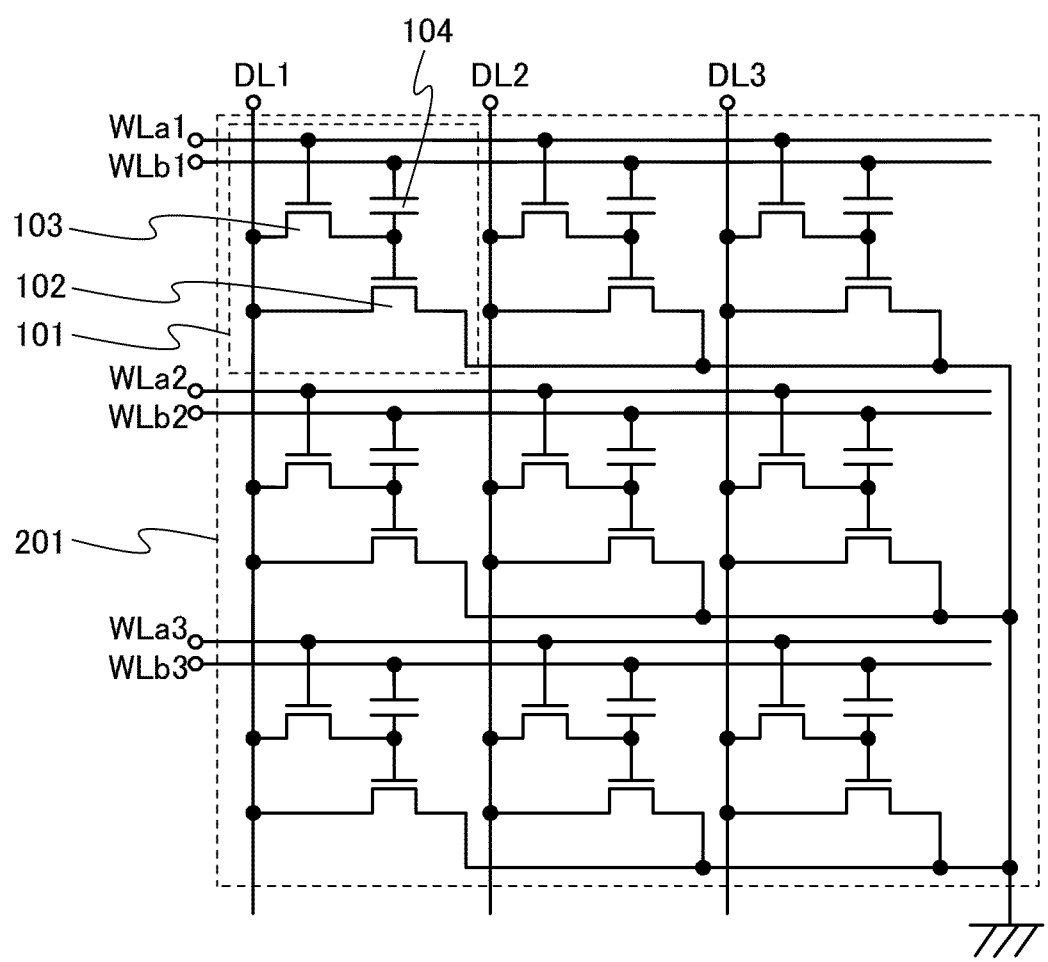
FIG. 7 is a circuit diagram of a memory portion.

FIG. 7 illustrates an example of a circuit diagram of a memory portion 201 including a plurality of memory cells 101 one of which is illustrated in FIG. 2C. For the structure of the memory cell 101, the description in Embodiment 1 can be referred to.

In the memory portion 201 illustrated in FIG. 7, a variety of wirings such as a plurality of first word lines WLa, a plurality of second word lines WLb, and a plurality of data lines DL is provided, and a signal or a fixed potential from a driver circuit is supplied to each of the memory cells 101 through the wirings. Therefore, the number of the wirings can be determined in accordance with the number of the memory cells 101 and arrangement of the memory cells 101.

Specifically, the memory portion 201 illustrated in FIG. 7 is an example in which memory cells are connected in a matrix with three rows and three columns and first word lines WLa1 to WLa3, second word lines WLb1 to WLb3, and data lines DL1 to DL3 are arranged.

Figure 8:
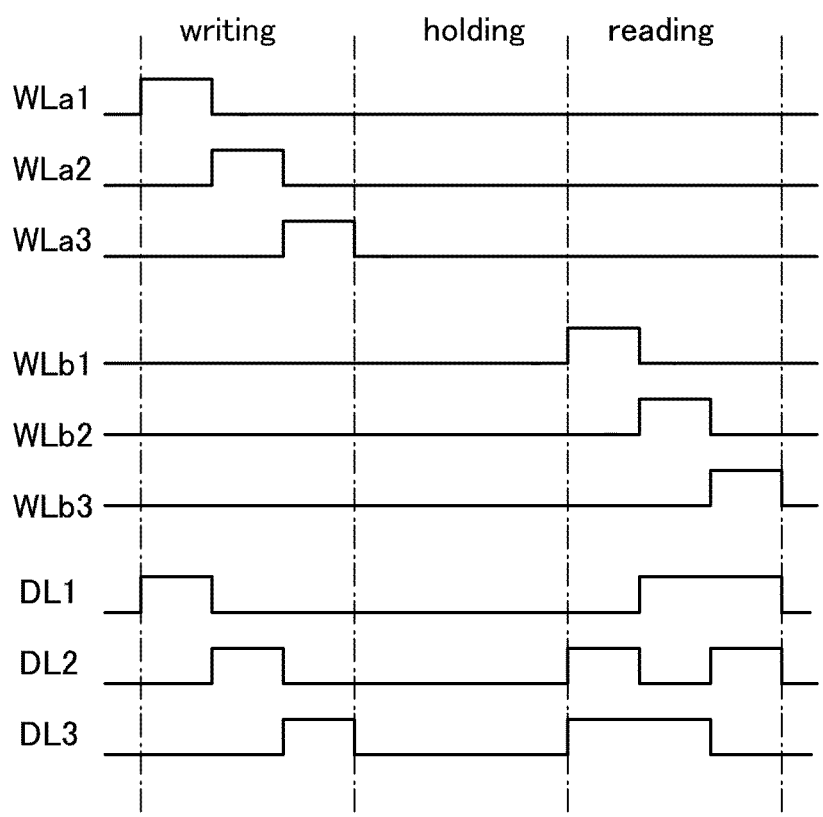
FIG. 8 is a timing chart of a memory portion.

Then, the operation of the memory portion 201 illustrated in FIG. 7 is described. FIG. 8 is a timing chart showing a change over time in the potentials of signals input to the first word lines WLa1 to WLa3, the second word lines WLb1 to WLb3, and the data lines DL1 to DL3. The timing chart in FIG. 8 illustrates, as an example, the case where both the transistor 102 and the transistor 103 are n-channel transistors and binary data is used.

Note that although rise or fall of the potential of each signal is denoted by a vertical line in the timing chart, it is easily understood by those skilled in the art that the waveform of each potential of a signal practically has a gentle slope due to the influence of a load of a wiring, noise, or the like.

First, operation of the memory portion 201 in data writing is described. In data writing, when a signal with a pulse is input to the first word line WLa1, a potential of the pulse, specifically, a high-level potential, is supplied to a gate electrode of each transistor 103 connected to the first word line WLa1. Thus, each transistor 103 whose gate electrode is connected to the first word line WLa1 is turned on. In contrast, a low-level potential is supplied to the second word lines WLb1 to WLb3.

Then, signals including data are input to the data lines DL1 to DL3. Needless to say, the levels of the potentials of the signals input to the data lines DL1 to DL3 are varied depending on data. A potential input to each of the data lines DL1 to DL3 is supplied, through each transistor 103 which is on, to a gate electrode of the transistor 102 and one of electrodes of the capacitor 104. The gate capacitance of the transistor 102 and the amount of charge accumulated in the capacitor 104 are controlled in accordance with the potential of the signal, so that data is written into the memory cell 101.

When the input of the signal with the pulse to the first word line WLa1 is finished, each transistor 103 whose gate electrode is connected to the first word line WLa1 is turned off. Then, signals with pulses are sequentially input to the first word line WLa2 and the first word line WLa3, and the above-described operation is similarly performed in memory cells 101 with the first word line WLa2 and memory cells 101 with the first word line WLa3.

Then, the operation of the memory portion 201 in data holding is described. In data holding, potentials with levels at which the transistor 103 is turned off, specifically, low-level potentials, are supplied to all of the first word lines WLa1 to WLa3. Since the transistor 103 has extremely small off-state current as described above, the gate capacitance of the transistor 102 and charge accumulated in the capacitor 104 are difficult to leak, and thus, the data can be held for a long period of time as compared to the case where light is not blocked or the case where a semiconductor material such as silicon is used for the transistor 103.

In contrast, low-level potentials are continuously supplied to the second word lines WLb1 to WLb3.

Then, the operation of the memory portion 201 in data reading is described. In data reading, low-level potentials are input to all of the first word lines WLa1 to WLa3, and thus, a low-level potential is supplied to the gate electrode of each transistor 103. Therefore, each transistor 103 whose gate electrode is connected to the first word lines WLa1 to WLa3 remains in an off state.

In contrast, a signal with a pulse is input to the second word line WLb1 and a potential of the pulse, specifically, a high-level potential, is supplied to the other of the electrodes of each of the capacitors 104. The potential difference between the pair of electrodes of the capacitor 104 is kept in accordance with the law of conservation of charge; thus, the change in the potential of the second word line WLb1 is supplied to the gate electrode of the transistor 102. Then, since the threshold voltage of the transistor 102 is changed in accordance with the amount of charge accumulated in its gate capacitance, drain current having an amount corresponding to the amount of charge accumulated in its gate capacitance flows through the transistor 102. The difference in the amount of accumulated charge is read from the amount of the drain current of the transistor 102, whereby data can be read from the data lines DL.

When the input of the signal with the pulse to the second word line WLb1 is finished, each transistor 102 in the memory cell 101 with the second word line WLb1 is turned off. Then, signals with pulses are sequentially input to the second word line WLb2 and the second word line WLb3, and the above-described operation is similarly performed in memory cells 101 with the second word line WLb2 and memory cells 101 with the second word line WLb3.

Note that a reading circuit is connected to an end of each of the data lines DL1 to DL3, and a signal output from the reading circuit includes data which is actually read from the memory portion 201.

Although in this embodiment, a driving method in which writing, holding, and reading of data are sequentially performed in a plurality of memory cells 101 is described, the present invention is not limited to this structure. Only a memory cell 101 with the specified address may perform the above operation.

FIG. 7 illustrates, as an example, the memory portion 201 in which four wirings including the first word line WLa, the second word line WLb, the data line DL, and a wiring for supplying a fixed potential to the transistor 102 are connected to each memory cell 101. However, in one embodiment of the present invention, the number of wirings included in each memory cell is not limited to this. The number of wirings and the connection structure may be determined as appropriate so that a signal for controlling switching of the transistor 103, a signal for controlling the amount of charge accumulated in the gate capacitance of the transistor 102, and a fixed potential can be supplied to each memory cell 101 and a potential including the amount of charge accumulated in the gate capacitance as data can be transmitted to the driver circuit.

This embodiment can be implemented in combination with any of the above embodiments as appropriate.

Embodiment 6

Figure 9:
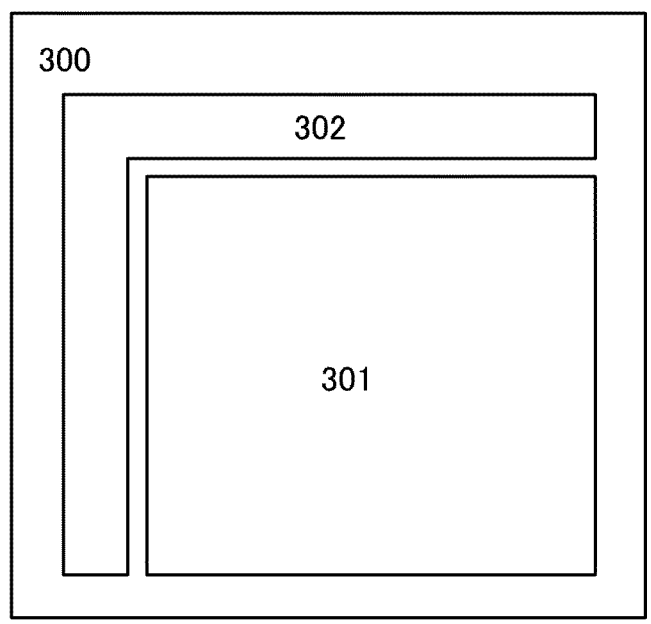
FIG. 9 is a block diagram of a memory device.

FIG. 9 illustrates a block diagram of a structure of a memory device according to one embodiment of the present invention, as an example. A memory device 300 illustrated in FIG. 9 includes a memory portion 301 provided with a plurality of memory cells and a driver circuit 302 for controlling operation of the memory portion 301.

The driver circuit 302 can control various kinds of operation such as writing of data into the memory portion 301, reading of data from the memory portion 301, and holding of data in the memory portion 301 in accordance with a signal from a control circuit.

FIG. 9 particularly illustrates the case where the control circuit for supplying a signal to the driver circuit 302 is not included in the memory device 300 but provided in the outside of the memory device 300. However, the control circuit may be included in components of the memory device.

Next, an example of a specific structure of the driver circuit in the memory device according to one embodiment of the present invention will be described.

Figure 10:
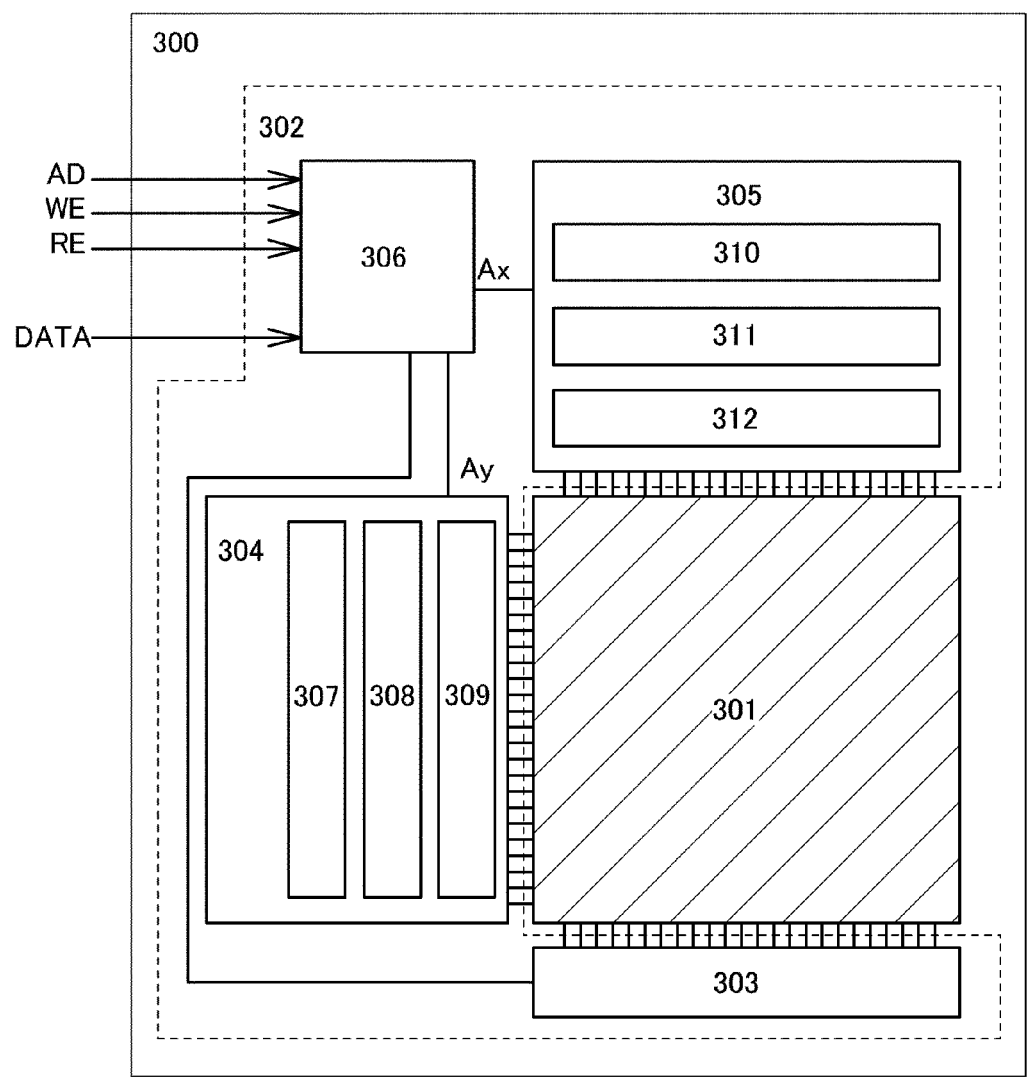
FIG. 10 is a block diagram of a memory device.

FIG. 10 illustrates, as an example, a block diagram of a specific structure of a memory device according to one embodiment of the present invention. Note that in the block diagram in FIG. 10, circuits in the memory device are classified in accordance with their functions and separated blocks are illustrated. However, it is difficult to classify actual circuits according to their functions completely and it is possible for one circuit to have a plurality of functions.

The memory device 300 illustrated in FIG. 10 includes the memory portion 301 and the driver circuit 302. The driver circuit 302 includes a reading circuit 303 which generates a signal including data read from the memory portion 301; a word line driver circuit 304 which selects a memory cell included in the memory portion 301 every row; and a data line driver circuit 305 which controls data writing in the selected memory cell in the memory portion 301. Further, the driver circuit 302 includes a control circuit 306 which controls operation of the reading circuit 303, the word line driver circuit 304, and the data line driver circuit 305.

In the memory device 300 illustrated in FIG. 10, the word line driver circuit 304 includes a decoder 307, a level shifter 308, and a buffer 309, and the data line driver circuit 305 includes a decoder 310, a level shifter 311, and a selector 312.

Note that it is acceptable as long as the memory device 300 according to one embodiment of the present invention includes at least the memory portion 301. Further, the memory device 300 according to one embodiment of the present invention includes, in its category, a memory module in which part of or all of the driver circuit 302 is connected to the memory portion 301. The memory module may be provided with a connection terminal which can be mounted on a printed wiring board or the like and may be protected with resin or the like, that is, may be packaged.

The memory portion 301, the reading circuit 303, the word line driver circuit 304, the data line driver circuit 305, and the control circuit 306 may be formed using one substrate. Alternatively, any one of the memory portion 301, the reading circuit 303, the word line driver circuit 304, the data line driver circuit 305, and the control circuit 306 may be formed using a substrate different from a substrate for the others, or all of them may be formed using different substrates.

In the case of using different substrates, electrical connection can be ensured with the use of an FPC (flexible printed circuit) or the like. In that case, part of the driver circuit 302 may be connected to an FPC by a COF (chip on film) method. Alternatively, electrical connection can be ensured by COG (chip on glass) method.

When a signal AD having an address (Ax, Ay) of the memory portion 301 as data is input to the memory device 300, the control circuit 306 transmits the address Ax of a column direction and the address Ay of a row direction to the data line driver circuit 305 and the word line driver circuit 304, respectively. In addition, the control circuit 306 transmits a signal DATA including data input to the memory device 300 to the data line driver circuit 305.

Selection of operation of data writing or operation of data reading in the memory portion 301 is performed in accordance with a signal RE (read enable), a signal WE (write enable), or the like which is supplied to the control circuit 306. Further, in the case where a plurality of the memory portions 301 is provided, a signal CE (chip enable) for selecting the memory portion 301 may be input to the control circuit 306. In that case, operation selected in accordance with the signal RE or the signal WE is performed in the memory portion 301 selected in accordance with the signal CE.

In the memory portion 301, when the writing operation is selected in accordance with the signal WE, a signal for selecting memory cells corresponding to the address Ay is generated in the decoder 307 included in the word line driver circuit 304 in response to an instruction from the control circuit 306. The amplitude of the signal is adjusted by the level shifter 308, and then, the waveform of the signal is processed in the buffer 309 and the processed signal is input to the memory portion 301. In the data line driver circuit 305, a signal for selecting a memory cell corresponding to the address Ax among the memory cells selected in the decoder 310 is generated in response to an instruction from the control circuit 306. The amplitude of the signal is adjusted by the level shifter 311, and then the processed signal is input to the selector 312. In the selector 312, the signal DATA is sampled in accordance with the input signal, and the sampled signal is input to a memory cell corresponding to the address (Ax, Ay).

In the memory portion 301, when the reading operation is selected in accordance with the signal RE, a signal for selecting memory cells corresponding to the address Ay is generated in the decoder 307 included in the word line driver circuit 304 in response to an instruction from the control circuit 306. The amplitude of the signal is adjusted by the level shifter 308, and then, the waveform of the signal is processed in the buffer 309 and the processed signal is input to the memory portion 301. In the reading circuit 303, a memory cell corresponding to the address Ax are selected among the memory cells selected by the decoder 307 in response to an instruction from the control circuit 306. Data stored in the memory cell corresponding to the address (Ax, Ay) is read, and a signal including the data is generated.

This embodiment can be implemented in combination with any of the above embodiments as appropriate.

Embodiment 7

In this embodiment, an example of a specific structure of a reading circuit will be described.

The levels of potentials read from the memory portion are determined in accordance with data written into the memory cells. Accordingly, in an ideal view, potentials having the same level should be read from the plurality of memory cells when data with the same digital value is stored in the plurality of memory cells. However, practically, there is a case where the characteristics of transistors serving as memory elements or transistors serving as switching elements in reading are varied among the memory cells. In that case, the potentials which are actually read are varied even if all of data to be read has the same digital value, so that the levels of the potentials can be widely distributed. Therefore, it is preferable to provide, in the driver circuit, a reading circuit in which a signal including correct data and having amplitude and waveform processed in accordance with the desired specification can be generated even when a little variation occurs in the potentials read from the memory portion.

Figure 11:
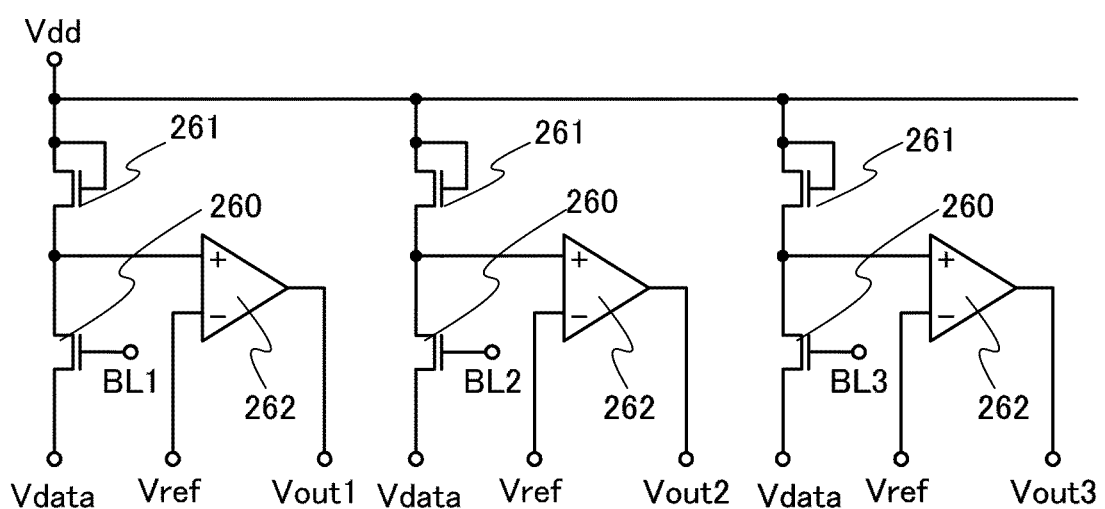
FIG. 11 is a circuit diagram of a reading circuit.

FIG. 11 illustrates an example of a circuit diagram of a reading circuit. The reading circuit in FIG. 11 includes transistors 260 which function as switching elements for controlling the input of potentials Vdata read from the memory portion to the reading circuit, and transistors 261 which function as resistors. In addition, the reading circuit in FIG. 11 includes operational amplifiers 262.

Specifically, in each of the transistors 261, a gate electrode is connected to a drain electrode (or a drain region). In addition, a high-level power supply potential Vdd is supplied to the gate electrode and the drain electrode. Further, in each of the transistors 261, a source electrode is connected to a non-inverting input terminal (+) of the operational amplifier 262. Accordingly, the transistor 261 functions as a resistor connected between a node to which the power supply potential Vdd is supplied and the non-inverting input terminal (+) of the operational amplifier 262. Note that although in FIG. 11, a transistor whose gate electrode is connected to the drain electrode is used as a resistor, the present invention is not limited to this. Alternatively, an element functioning as a resistor can be used.

Further, gate electrodes of the transistors 260 which function as switching elements are connected to bit lines BL1 to BL3. Then, the supply of potentials Vdata to source electrodes of the transistors 260 is controlled in accordance with potentials of the bit lines BL1 to BL3.

For example, when the transistor 260 connected to the bit line BL1 is turned on, a potential obtained by dividing the potential Vdata and the power supply potential Vdd using resistors, i.e., the transistor 260 and the transistor 261, is supplied to the non-inverting input terminal (+) of the operational amplifier 262. The level of the power supply potential Vdd is fixed; thus, the level of the potential obtained by the resistor division reflects the level of the potential Vdata, i.e., a digital value of read data.

In contrast, a reference potential Vref is supplied to inverting input terminals (−) of the operational amplifiers 262. The levels of the potentials Vout of output terminals can be varied depending on the level of the potential which is supplied to the non-inverting input terminals (+) with respect to the reference potential Vref. Thus, a signal which indirectly includes data can be obtained.

Note that even if data with the same value is stored in memory cells, levels of the read potential Vdata are varied due to variation in characteristics of the memory cells, so that the levels of potentials can be widely distributed sometimes. Therefore, the level of the reference potential Vref is determined in consideration of variation in the potential Vdata of a node in order to read the value of data accurately.

Since FIG. 11 illustrates an example of a reading circuit in the case of using a binary digital value, one operational amplifier used for reading data is used for each node to which the potential Vdata is supplied. However, the number of operational amplifiers is not limited to this. When n-valued data (n is a natural number of 2 or more) is used, the number of operational amplifiers used for each node to which the potential Vdata is supplied is n−1.

This embodiment can be implemented in combination with any of the above embodiments as appropriate.

Embodiment 8

In this embodiment, an example of a method for calculating off-state current of a transistor will be described.

Figure 12:
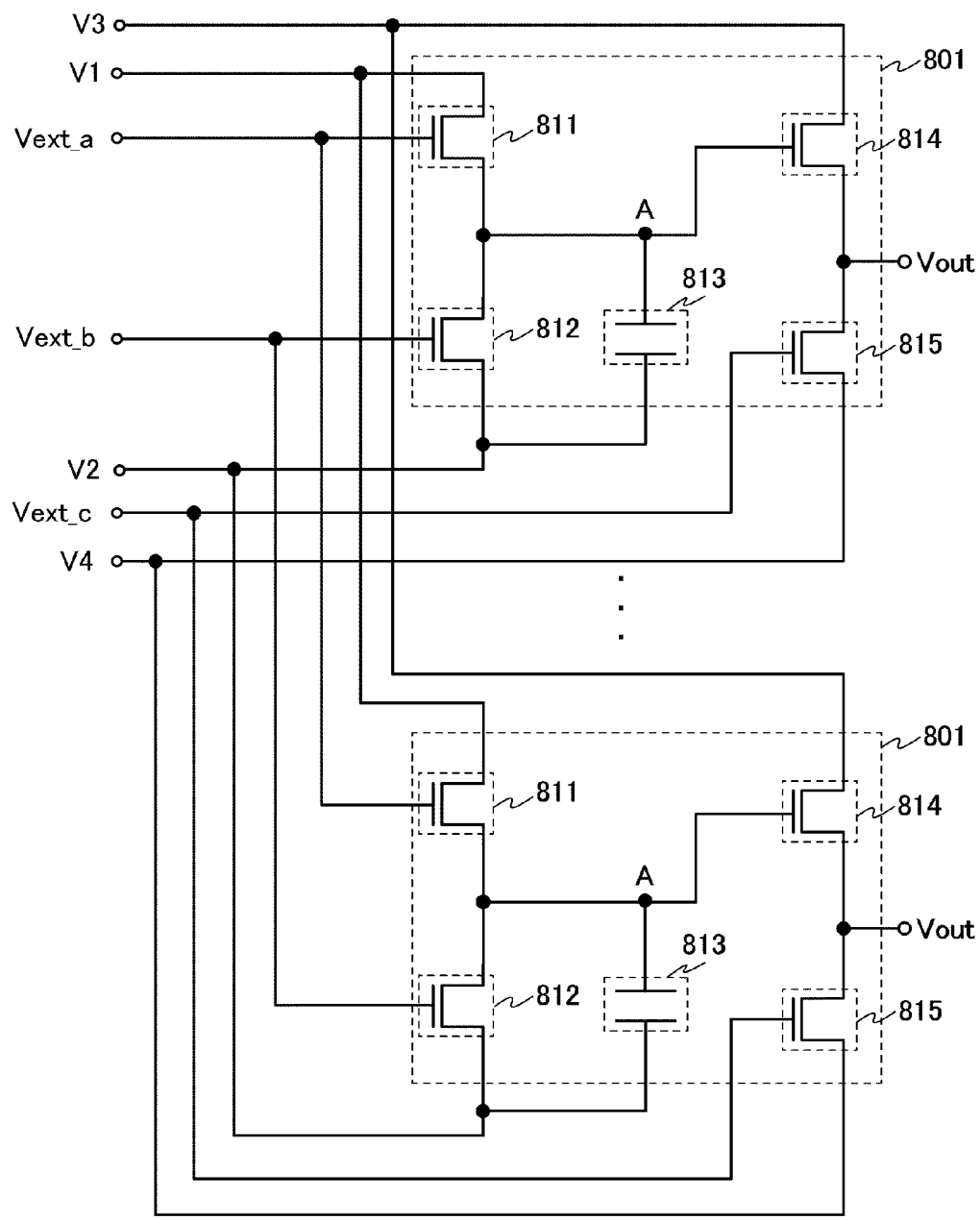
FIG. 12 is a circuit diagram of a test element group.

First, a structure of a test element group used for calculation of off-state current will be described with reference to FIG. 12. In this embodiment, the test element group includes a plurality of measurement systems 801 which are connected in parallel. Specifically, FIG. 12 illustrates an example of the test element group in which eight measurement systems 801 are connected in parallel.

Each of the measurement systems 801 includes a transistor 811, a transistor 812, a capacitor 813, a transistor 814, and a transistor 815.

The transistor 811 is a transistor for injection of charge. A first terminal of the transistor 811 is connected to a node which is supplied with a potential V1, and a second terminal of the transistor 811 is connected to a first terminal of the transistor 812. A gate electrode of the transistor 811 is connected to a node which is supplied with a potential Vext_a.

The transistor 812 is a transistor for evaluation of leakage current. Note that leakage current in this embodiment includes off-state current of a transistor. The first terminal of the transistor 812 is connected to the second terminal of the transistor 811 and a second terminal of the transistor 812 is connected to a node which is supplied with a potential V2. A gate electrode of the transistor 812 is connected to a node which is supplied with a potential Vext_b.

A first electrode of the capacitor 813 is connected to the second terminal of the transistor 811 and the first terminal of the transistor 812. A second electrode of the capacitor 813 is connected to the node which is supplied with the potential V2.

A first terminal of the transistor 814 is connected to a node which is supplied with a potential V3 and a second terminal of the transistor 814 is connected to a first terminal of the transistor 815. A gate electrode of the transistor 814 is connected to the second terminal of the transistor 811, the first terminal of the transistor 812, and the first electrode of the capacitor 813. Note that a portion to which the gate electrode of the transistor 814 is connected is referred to as a node A.

The first terminal of the transistor 815 is connected to the second terminal of the transistor 814 and a second terminal of the transistor 815 is connected to a node which is supplied with a potential V4. A gate electrode of the transistor 815 is connected to a node which is supplied with a potential Vext_c.

The measurement system 801 outputs a potential of the node where the second terminal of the transistor 814 and the first terminal of the transistor 815 are connected to each other as a potential Vout of an output signal.

In this embodiment, as the transistor 811, a transistor including an oxide semiconductor in an active layer, in which a channel formation region in the active layer has a channel length L of 10 μm and a channel width W of 10 μm, is used.

Note that a channel formation region corresponds to a region of a semiconductor film, which is between a source electrode and a drain electrode and which overlaps with a gate electrode with a gate insulating film provided therebetween.

Further, as each of the transistor 814 and the transistor 815, a transistor including an oxide semiconductor in an active layer, in which a channel formation region in the active layer has a channel length L of 3 μm and a channel width W of 100 μm, is used.

As the transistor 812, a bottom-gate transistor in which an oxide semiconductor is included in an active layer, a source electrode and a drain electrode are in contact with an upper portion of the active layer, an overlap region where the source electrode and the drain electrode overlap with a gate electrode is not provided, and an offset region having a width of 1 μm is provided is used. When the offset region is provided, the parasitic capacitance can be reduced. Further, as the transistor 812, a transistor in which a channel formation region in an active layer has one of the sizes of conditions 1 to 6 shown in table 1 below is used.

TABLE 1

| | channel length L [μm] | channel width W [μm] |
|---|---|---|
| condition 1 | 1.5 | $1 \times 10^5$ |
| condition 2 | 3 | $1 \times 10^5$ |
| condition 3 | 10 | $1 \times 10^5$ |
| condition 4 | 1.5 | $1 \times 10^6$ |
| condition 5 | 3 | $1 \times 10^6$ |
| condition 6 | 10 | $1 \times 10^6$ |

In the case where the transistor 811 for injection of charge is not provided in the measurement system 801, the transistor 812 for evaluation of leakage current needs to be turned on once at the time of injection of charge to the capacitor 813. In that case, it takes longer time for measurement when an element which takes time to be in a steady state of an off state from an on state is used as the transistor 812 for evaluation of leakage current. As illustrated in FIG. 12, the transistor 811 for injection of charge and the transistor 812 for evaluation of leakage current are separately provided in the measurement system 801, the transistor 812 for evaluation of leakage current can be always kept in an off state at the time of injection of charge. Consequently, time required for measurement can be shortened.

Moreover, when the transistor 811 for injection of charge and the transistor 812 for evaluation of leakage current are separately provided in the measurement system 801, each transistor can have an appropriate size. When the channel width W of the transistor 812 for evaluation of leakage current is larger than that of the transistor 811 for injection of charge, leakage current other than leakage current of the transistor 812 for evaluation of leakage current in the test element group can be relatively reduced. As a result, the leakage current of the transistor 812 for evaluation of leakage current can be measured with high accuracy. At the same time, the transistor 812 for evaluation of leakage current does not need to be turned on once at the time of injection of charge, so that there is no influence of change in the potential of the node A, due to flow of part of charge in a channel formation region into the node A.

On the other hand, when the channel width W of the transistor 811 for injection of charge is smaller than that of the transistor 812 for evaluation of leakage current, leakage current of the transistor 811 for injection of charge can be relatively reduced. Further, change in the potential of the node A, due to flow of part of the charge in the channel formation region into the node A, has little influence at the time of injection of charge.

As shown in FIG. 12, the plurality of the measurement systems 801 are connected in parallel, whereby the leakage current of the test element group can be calculated more accurately.

Next, a specific method for calculating the off-state current of a transistor with the use of the test element group illustrated in FIG. 12 will be described.

Figure 13:
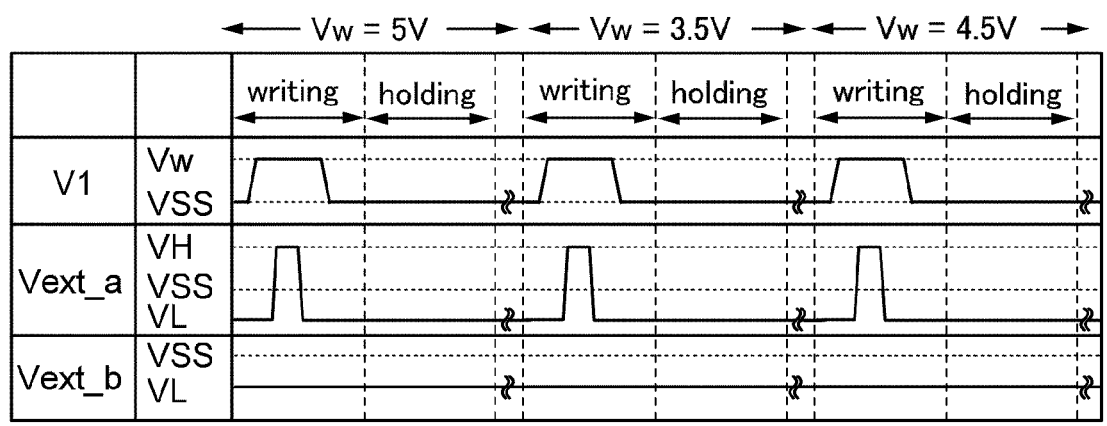
FIG. 13 is a timing chart of a test element group.

First, a method for measuring the leakage current of the test element group illustrated in FIG. 12 will be described with referent to FIG. 13. FIG. 13 is a timing chart for describing the method for measuring the leakage current with the use of the test element group illustrated in FIG. 12.

In the method for measuring leakage current with the use of the test element group illustrated in FIG. 12, a period is divided into a writing period and a holding period. Operations performed in these periods will be described below. Note that in both the writing period and the holding period, the potential V2 and the potential V4 are set to 0 V, the potential V3 is set to 5 V, and the potential Vext_c is set to 0.5 V.

First, in the writing period, the potential Vext_b is set to a potential VL (−3 V) so that the transistor 812 is turned off. Further, after the potential V1 is set to a writing potential Vw, the potential Vext_a is set to a potential VH (5 V) for a certain period so that the transistor 811 is turned on. With such a structure, charge is accumulated in the node A and the potential of the node A becomes equivalent to the value of the writing potential Vw. Next, the potential Vext_a is set to the potential VL so that the transistor 811 is turned off. After that, the potential V1 is set to a potential VSS (0 V).

Next, in the holding period, an amount of change in the potential of the node A, due to change in an amount of the charge held in the node A, is measured. A value of current flowing between the first terminal and the second terminal of the transistor 812 can be calculated from the amount of change in the potential. In such a manner, accumulation of charge in the node A and measurement of the amount of change in the potential of the node A can be performed.

Accumulation of charge in the node A and measurement of the amount of change in the potential of the node A (this operation is also referred to as accumulation and measurement operation) are performed repeatedly. First, a first accumulation and measurement operation is repeated 15 times. In the first accumulation and measurement operation, a potential of 5 V as the writing potential Vw is input in the writing period, and 1-hour holding is performed in the holding period. Next, a second accumulation and measurement operation is repeated twice. In the second accumulation and measurement operation, the writing potential Vw in the writing period is set to 3.5 V and 50-hour holding is performed in the holding period. Next, a third accumulation and measurement operation is performed once. In the third accumulation and measurement operation, the writing potential Vw in the writing period is set to 4.5 V and 10-hour holding is performed in the holding period. When the accumulation and measurement operation is repeated, it can be confirmed that the measured value of current is a value in a steady state. In other words, transient current (current which is reducing from start of measurement as time passes) can be removed from the current $I_A$ flowing through the node A. As a result, leakage current can be measured with higher accuracy.

In general, $V_A$ denoting the potential of the node A can be expressed as a function of the potential Vout of the output signal by the following equation.

$$V_A = F(Vout) \quad \text{[Formula 1]}$$

Charge $Q_A$ of the node A can be expressed by the following equation using the potential $V_A$ of the node A, capacitance $C_A$ of the capacitor connected to the node A, and a constant (const). The capacitance $C_A$ of the capacitor connected to the node A is the sum of the capacitance value of the capacitor 813 and the capacitance value of a capacitor other than the capacitor 813.

$$Q_A = C_A V_A + \text{const} \quad \text{[Formula 2]}$$

Current $I_A$ of the node A is the time derivatives of charge flowing to the node A (or charge flowing from the node A), so that the current $I_A$ of the node A is expressed by the following equation.

$$I_A \equiv \frac{\Delta Q_A}{\Delta t} = \frac{C_A \cdot \Delta F(Vout)}{\Delta t} \quad \text{[Formula 3]}$$

For example, $\Delta t$ is about 54000 seconds. The current $I_A$ of the node A can be obtained from the capacitance $C_A$ of the capacitor connected to the node A and the potential Vout of the output signal, so that leakage current of the test element group can be obtained.

Next, the results of measuring the potential Vout of the output signal by the measurement method using the above test element group, and the value of the leakage current of the test element group, which is calculated from the measurement results, are shown.

Figure 14:
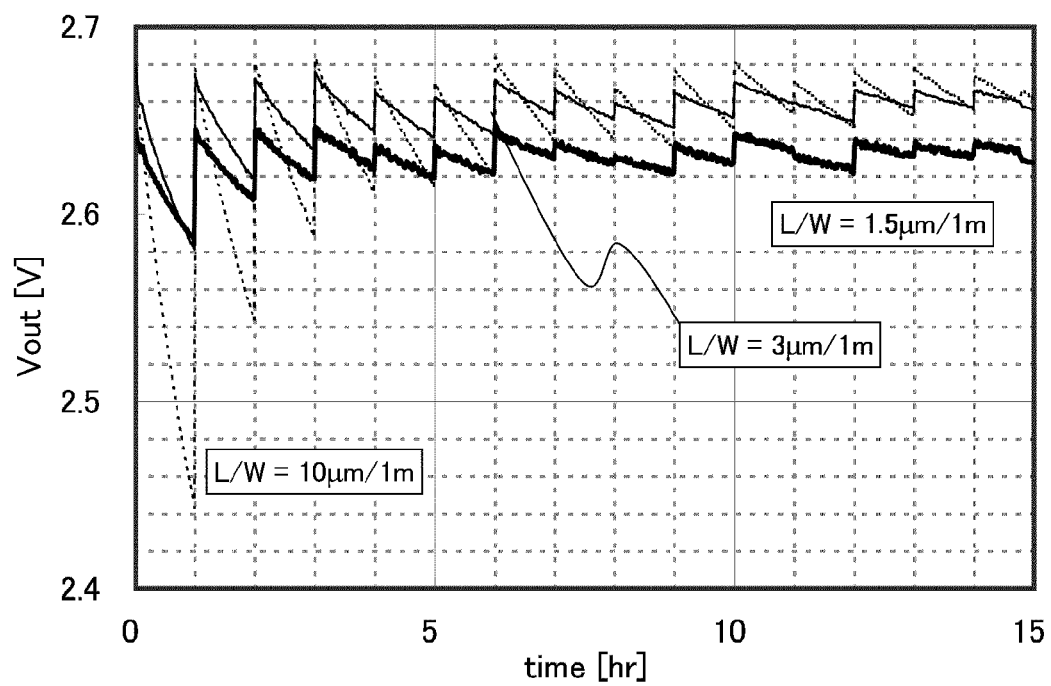
FIG. 14 is a graph showing a relation between elapsed time Time and a potential Vout of an output signal in a test element group.
Figure 15:
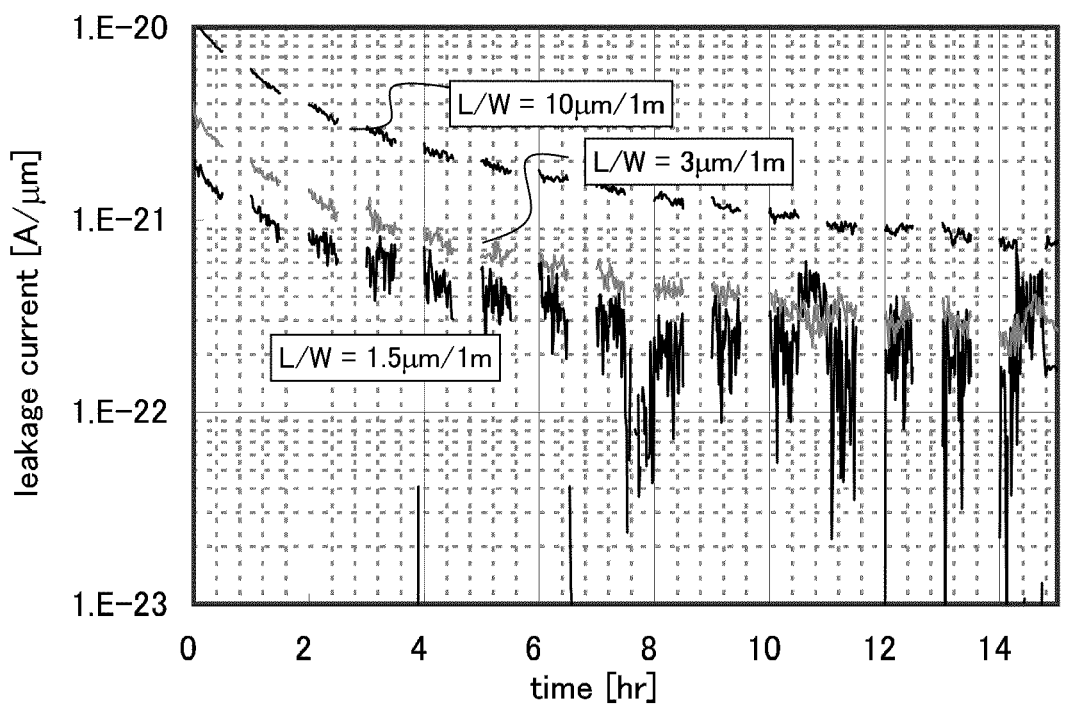
FIG. 15 is a graph showing a relation between elapsed time Time and leakage current calculated based on the measurement in a test element group.

FIG. 14 shows, as an example, a relation between the output voltage Vout and the elapsed time Time in the measurement (the first accumulation and measurement operation) under a condition 1, a condition 2, and a condition 3. FIG. 15 shows a relation between the elapsed time Time in the measurement and the leakage current calculated by the measurement. It is found that the potential Vout of the output signal is fluctuated after start of the measurement and that it takes 10 hours or longer to be in a steady state.

Figure 16:
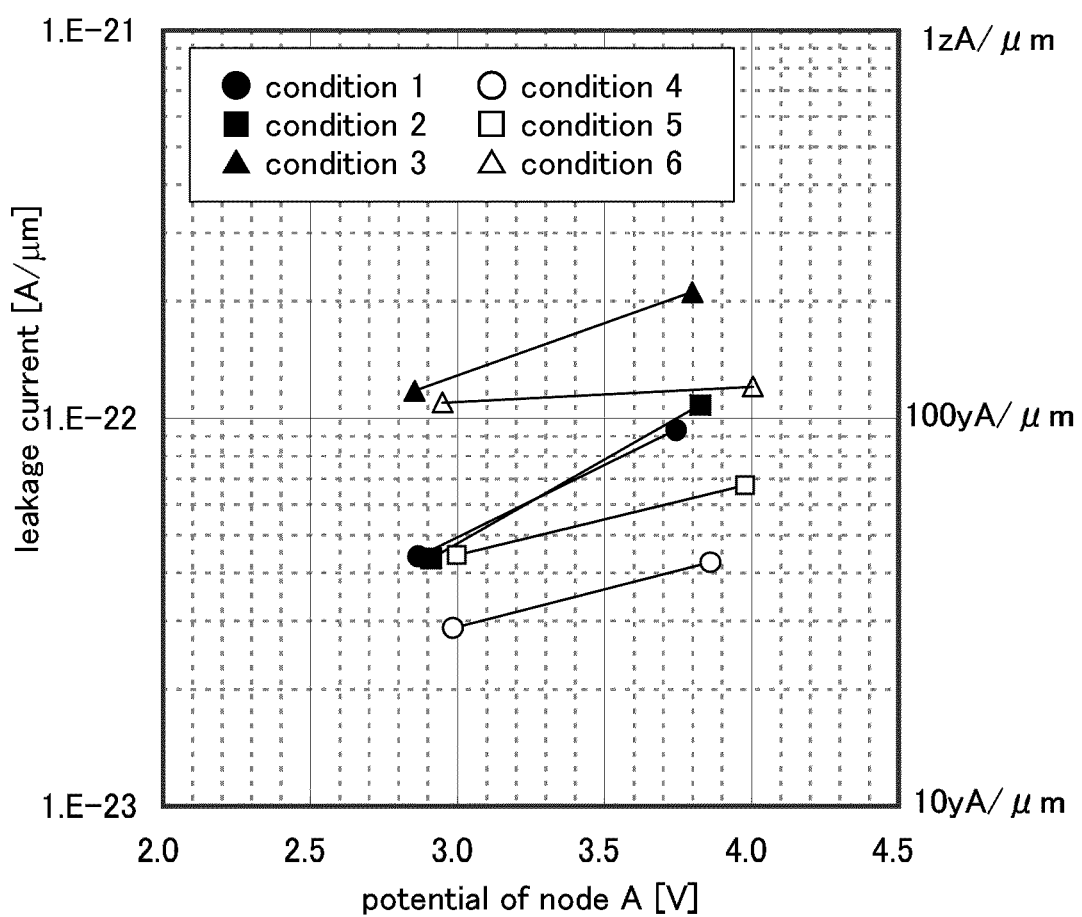
FIG. 16 is a graph showing a relation between a potential of a node A and leakage current in a test element group.

FIG. 16 shows a relation between the leakage current and the potential of the node A under conditions 1 to 6, which is estimated from the measurement. In FIG. 16, in the condition 4 for example, the leakage current is 28 yA/μm when the potential of the node A is 3.0 V. Since the leakage current includes the off-state current of the transistor 812, the off-state current of the transistor 812 can be considered to be 28 yA/μm or less.

As described above, in a test element group using a transistor including a highly purified oxide semiconductor layer serving as a channel formation layer, leakage current is sufficiently small and thus it is found that off-state current of the transistor is sufficiently small.

Embodiment 9

In this embodiment, an example of a structure of an RF tag, which is one of semiconductor devices of the present invention, will be described.

Figure 17:
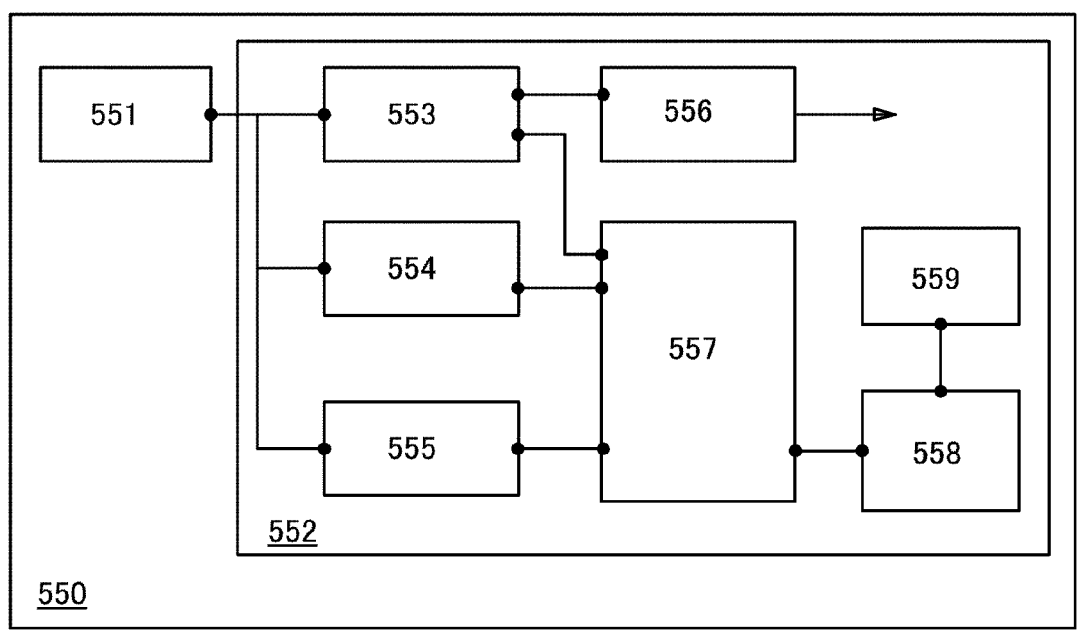
FIG. 17 is a block diagram of an RF tag.

FIG. 17 is a block diagram illustrating one mode of the RF tag of the present invention. In FIG. 17, an RF tag 550 includes an antenna circuit 551 and an integrated circuit 552. The integrated circuit 552 includes a power supply circuit 553, a demodulation circuit 554, a modulation circuit 555, a regulator 556, an arithmetic circuit 557, a memory device 558, and a boosting circuit 559.

An example of the operation of the RF tag 550 is described. When a radio wave is transmitted from an interrogator, the radio wave is converted into an AC voltage in the antenna circuit 551. In the power supply circuit 553, the AC voltage from the antenna circuit 551 is rectified to generate a voltage for a power supply. The voltage for a power supply, which is generated in the power supply circuit 553, is fed to the arithmetic circuit 557 and the regulator 556. After stabilizing the voltage for a power supply from the power supply circuit 553 or after adjusting the level thereof, the regulator 556 supplies the voltage to circuits such as the demodulation circuit 554, the modulation circuit 555, the arithmetic circuit 557, the memory device 558, or the boosting circuit 559 in the integrated circuit 552.

The demodulation circuit 554 demodulates an AC signal received by the antenna circuit 551 and outputs the signal to the arithmetic circuit 557 of the next stage. The arithmetic circuit 557 performs arithmetic processing in accordance with the signal input from the demodulation circuit 554 and generates another signal. In the above arithmetic processing, the memory device 558 can be used as a primary cache memory or a secondary cache memory. Further, the arithmetic circuit 557 analyzes the signal input from the demodulation circuit 554, and then outputs data in the memory device 558 or executes an instruction in the memory device 558 in response to an instruction transmitted from the interrogator. The signal output from the arithmetic circuit 557 is encoded and transmitted to the modulation circuit 555. The modulation circuit 555 modulates a radio wave received by the antenna circuit 551 in accordance with the signal. The radio wave modulated in the antenna circuit 551 is received by the interrogator.

In this manner, communication between the RF tag 550 and the interrogator is performed by modulating a radio wave used as a carrier (a carrier wave). As the carrier, there are radio waves with frequencies of 125 kHz, 13.56 MHz, 950 MHz, and the like, which are various depending on the standard. A modulation method includes various methods such as amplitude modulation, frequency modulation, and phase modulation, depending on the standard; however, any modulation method may be employed as long as it is based on the standard.

A transmission method of signals can be classified into various kinds such as an electromagnetic coupling method, an electromagnetic induction method, and a micro-wave method, and the like depending on the wavelength of a carrier.

The boosting circuit 559 boosts voltage output from the regulator 556 and supplies the voltage to the memory device 558.

A feature of one embodiment of the present invention is that the memory device 558 has the structure described in the foregoing embodiment and that memory capacity per unit area can be increased while a period for holding data is ensured. Accordingly, in the RF tag 550 according to one embodiment of the present invention, reliability of data can be increased with the use of the memory device 558. Further, with the use of the memory device 558, the RF tag 550 can be miniaturized, or can have high functionality.

In this embodiment, a structure of the RF tag 550 including the antenna circuit 551 is described; however, the RF tag according to one embodiment of the present invention does not necessarily include an antenna circuit. Further, the RF tag illustrated in FIG. 17 may be provided with an oscillation circuit or a secondary battery.

This embodiment can be implemented in combination with any of the above embodiments as appropriate.

Embodiment 10

In this embodiment, an example of a mobile memory medium which is one of semiconductor devices using a memory device according to one embodiment of the present invention will be described.

Figure 18A:
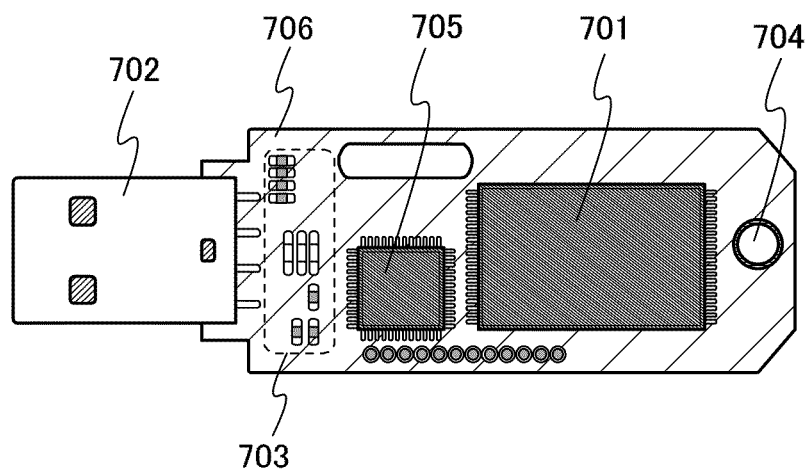
FIGS. 18A and 18B are views illustrating a structure of a memory medium.

FIG. 18A illustrates an example of a structure of a memory medium according to one embodiment of the present invention. In the memory medium in FIG. 18A, the following components are mounted on a printed wiring board 706: a memory device 701 according to one embodiment of the present invention; a connector 702 which performs electrical connection between a driving device and the memory medium; an interface 703 which performs a signal process on each signal input or output through the connector 702 in accordance with the various signals; a light-emitting diode 704 which lights in accordance with operation of the memory medium or the like; and a controller 705 which controls operation of circuits and semiconductor elements in the memory medium, such as the memory device 701, the interface 703, and the light-emitting diode 704. Further, a quartz oscillator which is used for generating a clock signal for controlling the operation of the controller 705, a regulator for controlling the level of the power supply potential in the memory medium, or the like may additionally be provided.

Figure 18B:
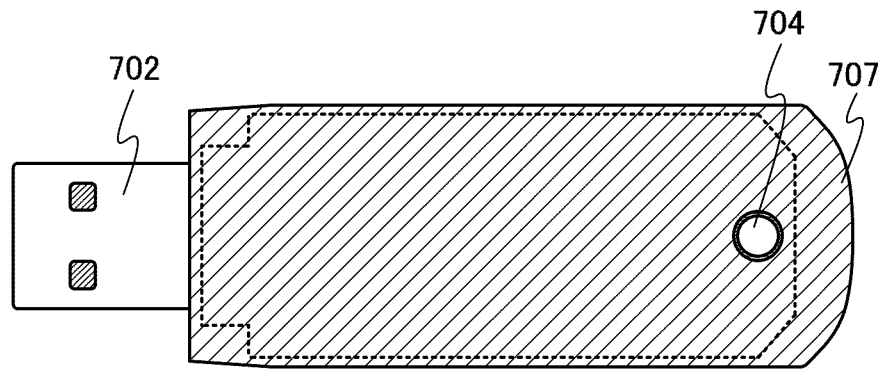

As illustrated in FIG. 18B, the printed wiring board 706 in FIG. 18A may be protected by being covered with a cover material 707 using a resin or the like so as to expose part of the connector 702 and part of the light-emitting diode 704.

A feature of the memory device 701 according to one embodiment of the present invention is that memory capacity per unit area can be increased while a period for holding data is ensured. Accordingly, in the memory medium according to one embodiment of the present invention, reliability of data can be increased with the use of the memory device 701. Further, with the use of the memory device 701, the memory medium can be miniaturized.

This embodiment can be implemented in combination with any of the above embodiments as appropriate.

Example 1

A semiconductor device according to one embodiment of the present invention can be used so that a highly reliable electronic device and an electronic device with high functionality can be provided.

Figure 19A:
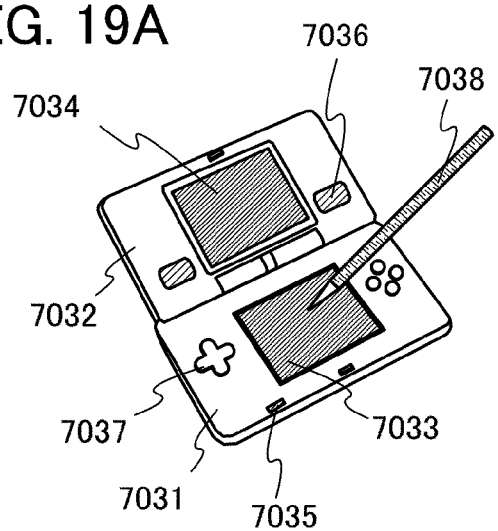
FIGS. 19A to 19C are each a view of an electronic appliance.
Figure 19B:
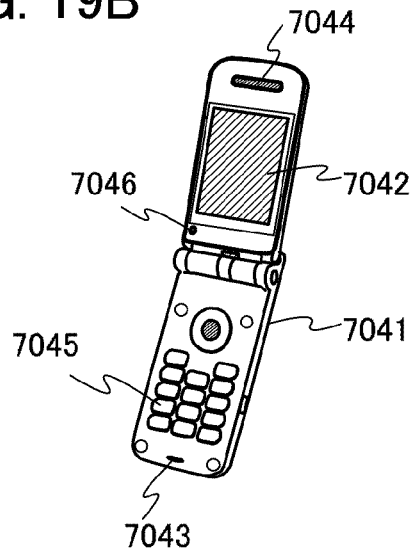
Figure 19C:
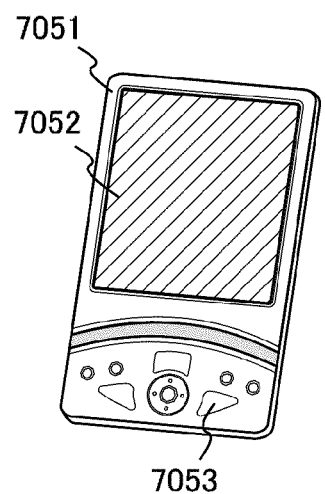

The semiconductor device according to one embodiment of the present invention can be used for display devices, notebook personal computers, or image reproducing devices provided with recording media (typically, devices which reproduce the content of recording media such as digital versatile discs (DVDs) and have displays for displaying the reproduced images). Other than the above, as an electronic device which can be provided with the semiconductor device according to one embodiment of the present invention, mobile phones, portable game machines, personal digital assistants, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 19A to 19C show specific examples of these electronic devices.

FIG. 19A illustrates a portable game machine including a housing 7031, a housing 7032, a display portion 7033, a display portion 7034, a microphone 7035, speakers 7036, an operation key 7037, a stylus 7038, and the like. The semiconductor device according to one embodiment of the present invention can be used for an integrated circuit for controlling the driving of the portable game machine. With the use of the semiconductor device which is one embodiment of the present invention for the integrated circuit for controlling the driving of the portable game machine, a highly reliable portable game machine and a portable game machine having high functionality can be provided. Although the portable game machine illustrated in FIG. 19A includes two display portions 7033 and 7034, the number of display portions included in the portable game machine is not limited to two.

FIG. 19B illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electrical signals, whereby external images can be loaded. The semiconductor device according to one embodiment of the present invention can be used for an integrated circuit for controlling driving of the mobile phone. With the use of the semiconductor device which is one embodiment of the present invention for the integrated circuit for controlling driving of the mobile phone, a highly reliable mobile phone and a mobile phone having high functionality can be provided.

FIG. 19C illustrates a personal digital assistant including a housing 7051, a display portion 7052, operation keys 7053, and the like. A modem may be incorporated in the housing 7051 of the personal digital assistant illustrated in FIG. 19C. The semiconductor device according to one embodiment of the present invention can be used for an integrated circuit for controlling driving of the personal digital assistant. With the use of the semiconductor device which is one embodiment of the present invention for the integrated circuit for controlling driving of the personal digital assistant, a highly reliable personal digital assistant and a personal digital assistant having high functionality can be provided.

This example can be implemented in combination with any of the above embodiments as appropriate.

This application is based on Japanese Patent Application serial no. 2010-116971 filed with Japan Patent Office on May 21, 2010, the entire contents of which are hereby incorporated by reference.

The invention claimed is:

1. A memory device comprising:
   a memory cell comprising:
      a transistor including:
         an oxide semiconductor layer; and
         a source electrode and a drain electrode electrically connected to the oxide semiconductor layer;
      a capacitor of which one electrode is directly connected to one of the source electrode and the drain electrode; and
      a light-blocking layer overlapping an entire portion of the oxide semiconductor layer, the light-blocking layer directly connected to the one of the source electrode and the drain electrode,
   wherein at least one of electrodes of the capacitor has a light-blocking property,
   wherein the oxide semiconductor layer is between the one of electrodes and the light-blocking layer, and
   wherein the one of electrodes is overlapped by a channel formation region of the oxide semiconductor layer in order to prevent light from entering the channel formation region.

2. The memory device according to claim 1,
   wherein the light-blocking layer is a wiring including at least one material selected from molybdenum, titanium, chromium, tantalum, tungsten, aluminum, copper, neodymium, and scandium.

3. The memory device according to claim 1, wherein when a wavelength at an absorption edge of an oxide semiconductor of the oxide semiconductor layer is $\lambda_0$, in the light-blocking layer, transmittance of light having a wavelength longer than or equal to 100 nm and shorter than or equal to $\lambda_0+100$ nm is lower than or equal to 50%.

4. The memory device according to claim 1, wherein when a wavelength at an absorption edge of an oxide semiconductor of the oxide semiconductor layer is $\lambda_0$, in the one of electrodes having a light-blocking property, transmittance of light having a wavelength longer than or equal to 100 nm and shorter than or equal to $\lambda_0+100$ nm is lower than or equal to 50%.

5. The memory device according to claim 1, wherein the oxide semiconductor layer comprises an In—Ga—Zn—O-based oxide semiconductor.

6. The memory device according to claim 1, wherein hydrogen concentration of the oxide semiconductor layer is lower than or equal to $5\times10^{19}/cm^3$.

7. A memory device comprising:
   a memory cell comprising:
      a first transistor including an oxide semiconductor layer;
      a second transistor including a silicon semiconductor layer;
      a capacitor; and
      a light-blocking layer,
   wherein the first transistor is configured to control supply of a potential to a gate electrode of the second transistor,
   wherein the capacitor is configured to hold the potential of the gate electrode of the second transistor,
   wherein at least one of electrodes of the capacitor has a light-blocking property,
   wherein the oxide semiconductor layer is between the one of electrodes and the light-blocking layer,
   wherein the light-blocking layer overlaps an entire upper surface of the oxide semiconductor layer, and
   wherein both electrodes of the capacitor are overlapped by an entire bottom surface of the oxide semiconductor layer in order to prevent light from entering a channel formation region of the oxide semiconductor layer.

8. The memory device according to claim 7,
   wherein the light-blocking layer is a light-blocking insulating film,
   wherein the light-blocking insulating film comprises a resin, and
   wherein a silicon nitride film, a silicon nitride oxide film, an aluminum nitride film, or an aluminum nitride oxide film is positioned between the oxide semiconductor layer and the light-blocking insulating film.

9. The memory device according to claim 7,
   wherein the light-blocking layer is a wiring, and
   wherein the wiring is connected to a source electrode or a drain electrode of the first transistor.

10. The memory device according to claim 7, wherein when a wavelength at an absorption edge of an oxide semiconductor of the oxide semiconductor layer is $\lambda_0$, in the light-blocking layer, transmittance of light having a wavelength longer than or equal to 100 nm and shorter than or equal to $\lambda_0+100$ nm is lower than or equal to 50%.

11. The memory device according to claim 7, wherein when a wavelength at an absorption edge of an oxide semiconductor of the oxide semiconductor layer is $\lambda_0$, in the one of electrodes having a light-blocking property, transmittance of light having a wavelength longer than or equal to 100 nm and shorter than or equal to $\lambda_0+100$ nm is lower than or equal to 50%.

12. The memory device according to claim 7, wherein the oxide semiconductor layer comprises an In—Ga—Zn—O-based oxide semiconductor.

13. The memory device according to claim 7, wherein hydrogen concentration of the oxide semiconductor layer is lower than or equal to $5\times10^{19}/cm^3$.

14. A memory device comprising:
   a memory cell comprising:
      a transistor including an oxide semiconductor layer;
      a capacitor; and
      a light-blocking layer comprising an insulating resin,
   wherein charge flowing in or out of the capacitor is controlled by the transistor,
   wherein at least one of electrodes of the capacitor has a light-blocking property,
   wherein the oxide semiconductor layer is between the one of electrodes and the light-blocking layer,
   wherein the light-blocking layer overlaps an entire upper surface of the oxide semiconductor layer, and
   wherein both electrodes of the capacitor are overlapped by an entire bottom surface of the oxide semiconductor layer.

15. The memory device according to claim 14,
   wherein a silicon nitride film, a silicon nitride oxide film, an aluminum nitride film, or an aluminum nitride oxide film is positioned between the oxide semiconductor layer and the light-blocking layer.

16. The memory device according to claim 14, wherein when a wavelength at an absorption edge of an oxide semiconductor of the oxide semiconductor layer is $\lambda_0$, in the light-blocking layer, transmittance of light having a wavelength longer than or equal to 100 nm and shorter than or equal to $\lambda_0+100$ nm is lower than or equal to 50%.

17. The memory device according to claim 14, wherein when a wavelength at an absorption edge of an oxide semiconductor of the oxide semiconductor layer is $\lambda_0$, in the one of electrodes having a light-blocking property, transmittance of light having a wavelength longer than or equal to 100 nm and shorter than or equal to $\lambda_0+100$ nm is lower than or equal to 50%.

18. The memory device according to claim 14, wherein the oxide semiconductor layer comprises an In—Ga—Zn—O-based oxide semiconductor.

19. The memory device according to claim 14, wherein hydrogen concentration of the oxide semiconductor layer is lower than or equal to $5\times10^{19}/cm^3$.

* * * * *